(12) United States Patent
Kim

(10) Patent No.: US 11,482,261 B2
(45) Date of Patent: Oct. 25, 2022

(54) MEMORY DEVICE AND METHOD OF OPERATING WITH DIFFERENT INPUT/OUTPUT MODES

(71) Applicant: SK hynix Inc., Icheon-si (KR)

(72) Inventor: Sang Hwan Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/242,988

(22) Filed: Apr. 28, 2021

(65) Prior Publication Data

US 2022/0130436 A1    Apr. 28, 2022

(30) Foreign Application Priority Data

Oct. 23, 2020   (KR) .................. 10-2020-0138382

(51) Int. Cl.
*G11C 7/10* (2006.01)
*G11C 7/22* (2006.01)
*G11C 16/26* (2006.01)
*G11C 16/10* (2006.01)

(52) U.S. Cl.
CPC .......... *G11C 7/1045* (2013.01); *G11C 7/1069* (2013.01); *G11C 7/1096* (2013.01); *G11C 7/222* (2013.01); *G11C 16/102* (2013.01); *G11C 16/26* (2013.01)

(58) Field of Classification Search
CPC ... G11C 7/1045; G11C 7/1069; G11C 7/1096; G11C 7/222; G11C 16/102; G11C 16/26
See application file for complete search history.

(56) References Cited

U.S. PATENT DOCUMENTS

| 7,533,310 | B2 * | 5/2009 | Park ...................... G11C 29/56 714/719 |
| 9,996,485 | B2 * | 6/2018 | Shaeffer ................ G06F 1/3275 |
| 10,102,887 | B2 * | 10/2018 | Ware .................... G11C 7/1012 |

FOREIGN PATENT DOCUMENTS

| KR | 1020080107762 A | 12/2008 |
| KR | 101917165 B1 | 11/2018 |

* cited by examiner

*Primary Examiner* — Vanthu T Nguyen
(74) *Attorney, Agent, or Firm* — William Park & Associates Ltd.

(57) ABSTRACT

A memory device, and a method of operating the same, includes a plurality of pages, a peripheral circuit, and control logic. The peripheral circuit is configured to receive a command, an address, and data from an external controller to program a page selected from among the plurality of pages, and to generate internal input data depending on an input mode for the command, the address, and the data. The control logic is configured to determine whether internal input data is to be generated based on the data depending on the input mode and to control the peripheral circuit so that a program operation of programming the internal input data is performed.

19 Claims, 16 Drawing Sheets

MEMORY DEVICE AND METHOD OF OPERATING WITH DIFFERENT INPUT/OUTPUT MODES

CROSS-REFERENCE TO RELATED APPLICATION

The present application claims priority under 35 U.S.C. § 119(a) to Korean patent application number 10-2020-0138382 filed on Oct. 23, 2020, in the Korean Intellectual Property Office, the entire disclosure of which is incorporated by reference herein.

BACKGROUND

1. Technical Field

Various embodiments of the present disclosure generally relate to an electronic device, and more particularly to a memory device and a method of operating the memory device.

2. Related Art

A storage device is a device which stores data under the control of a host device such as a computer, a smartphone, or a smartpad. Examples of a storage device include a device such as a hard disk drive (HDD) which stores data in a magnetic disk, and a device such as a solid state drive (SSD) or a memory card which stores data in semiconductor memory, particularly, nonvolatile memory, according to the device in which data is stored.

The storage device may include a memory device in which data is stored and a memory controller which controls the storage of the data in the memory device. Such memory devices may be classified as a volatile memory device or a nonvolatile memory device. Representative examples of nonvolatile memory include read only memory (ROM), programmable ROM (PROM), electrically programmable ROM (EPROM), electrically erasable programmable ROM (EEPROM), flash memory, phase-change random access memory (PRAM), magnetic RAM (MRAM), resistive RAM (RRAM), and ferroelectric RAM (FRAM).

SUMMARY

Various embodiments of the present disclosure are directed to a memory device that increases a data input speed when data is input using only some of a greater number of input/output lines, and a method of operating the memory device.

In accordance with an embodiment of the present disclosure is a memory device including a plurality of pages, a peripheral circuit, and control logic. The peripheral circuit is configured to receive a command, an address, and data from an external controller to program a page selected from among the plurality of pages, and to generate internal input data depending on an input mode for the command, the address, and the data. The control logic is configured to determine whether internal input data is to be generated based on the data depending on the input mode and to control the peripheral circuit so that a program operation of programming the internal input data is performed.

In accordance with another embodiment of the present disclosure is a memory device including a plurality of pages, a mode setter, and input controller, and a control signal generator. The mode setter is configured to set a mode in which a command, an address, and data are received from an external controller to program a page selected from among the plurality of pages. The input controller is configured to generate internal input data based on the data depending on the mode set by the mode setter, and the control signal generator is configured to generate a control signal for controlling the input controller to generate the internal input data.

In accordance with an additional embodiment of the present disclosure is a method of operating a memory device. The method includes setting a mode in which a command, an address, and data are received from an external controller to program a page selected from among a plurality of pages. The method also includes receiving the data based on the set mode, generating a control signal for generating internal input data based on the data depending on the set mode, and generating the internal input data based on the control signal.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure will now be described more fully hereinafter with reference to the accompanying drawings, in which embodiments of the present disclosure are illustrated, so that those of ordinary skill in the art can carry out the technical idea of the present disclosure.

Figure 1:
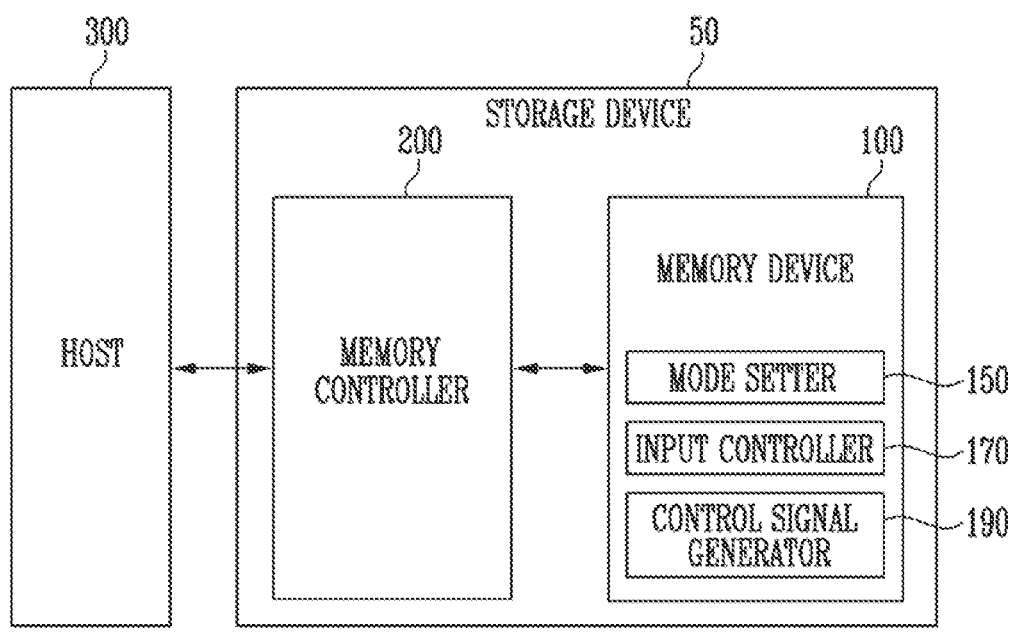
FIG. 1 is a block diagram illustrating a storage device.

FIG. 1 is a block diagram illustrating a storage device.

Referring to FIG. 1, a storage device 50 may include a memory device 100 and a memory controller 200.

The storage device 50 may be a device which stores data under the control of a host 300, such as a mobile phone, a smartphone, an MP3 player, a laptop computer, a desktop computer, a game console, a television (TV), a tablet PC, or an in-vehicle infotainment system.

The storage device 50 may be manufactured as any one of various types of storage devices depending on a host interface that is a scheme for communication with the host 300. For example, the storage device 50 may be implemented as any one of various types of storage devices, for instance, a solid state disk (SSD); a multimedia card such as an MMC, an embedded MMC (eMMC), a reduced size MMC (RS-MMC), or a micro-MMC; a secure digital card such as an SD, a mini-SD, or a micro-SD; a universal serial bus (USB) storage device; a universal flash storage (UFS) device; a personal computer memory card international association (PCMCIA) card-type storage device; a peripheral component interconnection (PCI)-card type storage device; a PCI express (PCI-E) card-type storage device; a compact flash (CF) card; a smart media card; and a memory stick.

The storage device 50 may be manufactured in any one of various types of package forms. For example, the storage device 50 may be manufactured as a package on package (POP), a system in package (SIP), a system on chip (SOC), a multi-chip package (MCP), a chip on board (COB), a wafer-level fabricated package (WFP), or a wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells, which may constitute a plurality of pages. In an embodiment, each page may be a unit by which data is stored in the memory device 100 or by which data stored in the memory device 100 is read. A memory block may be a unit by which data is erased.

In an embodiment, the memory device 100 may take many alternative forms, such as including double data rate synchronous dynamic random access memory (DDR SDRAM), low power double data rate fourth generation (LPDDR4) SDRAM, graphics double data rate (GDDR) SDRAM, low power DDR (LPDDR) SDRAM, Rambus dynamic random access memory (RDRAM), NAND flash memory, vertical NAND flash memory, NOR flash memory device, resistive RAM (RRAM), phase-change RAM (PRAM), magnetoresistive RAM (MRAM), ferroelectric RAM (FRAM), or spin transfer torque RAM (STT-RAM). In the present specification, for convenience of description, it is assumed that the memory device 100 includes NAND flash memory.

The memory device 100 may be implemented in a two-dimensional (2D) array structure or a three-dimensional (3D) array structure. Hereinafter, although a 3D array structure is described as an embodiment, the present disclosure is not limited to the 3D array structure. The present disclosure may also be applied not only to a flash memory device in which a charge storage layer is formed of a conductive floating gate (FG), but also to a charge trap flash (CTF) memory device in which a charge storage layer is formed of an insulating layer.

In an embodiment, the memory device 100 may be operated in a single-level cell (SLC) manner in which one data bit is stored in one memory cell. Alternatively, the memory device 100 may be operated in a manner in which at least two data bits are stored in one memory cell. For example, the memory device 100 may be operated in a multi-level cell (MLC) manner in which two data bits are stored in one memory cell, a triple-level cell (TLC) manner in which three data bits are stored in one memory cell, or a quadruple-level cell (QLC) manner in which four data bits are stored in one memory cell.

The memory device 100 may receive a command and an address from the memory controller 200, and may access the area of the memory cell array selected by the address. That is, the memory device 100 may perform an operation corresponding to the command on the area selected by the address. For example, the memory device 100 may perform a write operation (i.e., program operation), a read operation, or an erase operation in response to the received command. When a program command is received, the memory device 100 may program data to the area selected by the address. When a read command is received, the memory device 100 may read data from the area selected by the address. When an erase command is received, the memory device 100 may erase data stored in the area selected by the address.

In an embodiment, the memory device 100 may include a mode setter 150. The mode setter 150 may set input/output modes for using all or some of the input/output lines coupled to the memory device 100.

In detail, when data is input/output using all of the input/output lines coupled to the memory device 100, an input/output mode may be an X8 mode. However, when data is input/output using half of the input/output lines coupled to the memory device 100, the input/output mode may be an X4 mode. Therefore, the mode setter 150 may set the X4 mode or the X8 mode based on the number of lines determined to input/output data by the memory device 100.

The mode setter 150 may generate a line enable signal TM_X4_MODE in a high state so as to set the X4 mode or the X8 mode. For example, when the line enable signal TM_X4_MODE makes a transition from a low state to a high state, the memory device 100 may input/output data in the X4 mode. As used herein, a signal, such the line enable signal TM_X4_MODE, having a high state distinguishes from the signal when it has a low state. The high and low states may represent different logic states. For example, the high state may correspond to the signal having a first voltage, and the low state may correspond to the signal having a second voltage. For some embodiments, the first voltage is greater than the second voltage. In other embodiments, different characteristics of a signal, such as frequency or amplitude, determine whether the signal is in a high state or a low state. For some cases, the high and low states of a signal represent logical binary states.

In an embodiment, when a test operation is performed on the memory device 100, the mode setter 150 may set input/output lines for coupling the memory device 100 to a test device (test equipment). Therefore, during a test operation, the mode setter 150 may set the input/output mode of the memory device 100 to the X4 mode or the X8 mode.

In an embodiment, the memory device 100 may include an input controller 170. The input controller 170 may generate new data based on input data when the data is input using only some of the input/output lines coupled to the memory device 100.

The time required for data input may be reduced by inputting the new data, generated by the input controller 170 based on the data received through some lines, to the memory device 100. That is, when data is input through some lines, a lot of time may be taken compared to the case where data is input through all lines, but such data input time may be reduced through data control by the input controller 170.

In an embodiment, a control signal generator 190 may generate a control signal for controlling the input controller 170 to generate new data based on the data received through some input/output lines. Here, the control signal generator 190 may generate a fast mode signal X4_FASTLOAD or a normal mode signal X4_CURRENT.

In detail, when the control signal generator 190 generates the fast mode signal X4_FASTLOAD and outputs the same to the input controller 170, the input controller 170 may generate new data based on the data received through some lines. However, when the control signal generator 190 generates the normal mode signal X4_CURRENT and outputs the same to the input controller 170, the input controller 170 may output the data received through all lines without change.

The memory controller 200 may control the overall operation of the storage device 50.

When a supply voltage is applied to the storage device 50, the memory controller 200 may run firmware. When the memory device 100 is a flash memory device 100, the memory controller 200 may run firmware such as a Flash Translation Layer (FTL) for controlling communication between the host 300 and the memory device 100.

In an embodiment, the memory controller 200 may include firmware (not illustrated) which may receive data and a logical block address (LBA) from the host 300, and may translate the logical block address (LBA) into a physical block address (PBA) indicating the address of memory cells which are included in the memory device 100 and in which data is to be stored. Further, the memory controller 200 may store a logical-physical address mapping table, which configures mapping relationships between logical block addresses (LBA) and physical block addresses (PBA), in a buffer memory.

The memory controller 200 may control the memory device 100 so that a program operation, a read operation, or an erase operation is performed in response to a request received from the host 300. For example, when a program request is received from the host 300, the memory controller 200 may convert the program request into a program command, and may provide the program command, a physical block address (PBA), and data to the memory device 100. When a read request together with a logical block address is received from the host 300, the memory controller 200 may convert the read request into a read command, select a physical block address corresponding to the logical block address, and thereafter provide the read command and the physical block address (PBA) to the memory device 100. When an erase request together with a logical block address is received from the host 300, the memory controller 200 may convert the erase request into an erase command, select a physical block address corresponding to the logical block address, and thereafter provide the erase command and the physical block address (PBA) to the memory device 100.

In an embodiment, the memory controller 200 may autonomously generate a program command, an address, and data without receiving a request from the host 300, and may transmit them to the memory device 100. For example, the memory controller 200 may provide commands, addresses, and data to the memory device 100 so as to perform background operations, such as a program operation for wear leveling and a program operation for garbage collection.

In an embodiment, the storage device 50 may include buffer memory (not illustrated). The memory controller 200 may control data exchange between the host 300 and the buffer memory (not illustrated). Alternatively, the memory controller 200 may temporarily store system data for controlling the memory device 100 in the buffer memory. For example, the memory controller 200 may temporarily store data, input from the host 300, in the buffer memory, and may then transmit the data, temporarily stored in the buffer memory, to the memory device 100.

In various embodiments, the buffer memory may be used as working memory or cache memory for the memory controller 200. The buffer memory may store codes or commands that are executed by the memory controller 200. Alternatively, the buffer memory may store data that is processed by the memory controller 200.

In an embodiment, the buffer memory may be implemented as DRAM such as a double data rate SDRAM (DDR SDRAM), double data rate fourth generation (DDR4) SDRAM, low power double data rate fourth generation (LPDDR4) SDRAM, graphics double data rate (GDDR) SDRAM, low power DDR (LPDDR) SDRAM, or Rambus DRAM (RDRAM), or as static RAM (SRAM).

In various embodiments, the buffer memory may be coupled to the storage device 50 outside the storage device 50. In this case, volatile memory devices coupled to the outside of the storage device 50 may function as the buffer memory.

In an embodiment, the memory controller 200 may control at least two memory devices. In this case, the memory controller 200 may control the memory devices depending on an interleaving scheme to improve operating performance.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
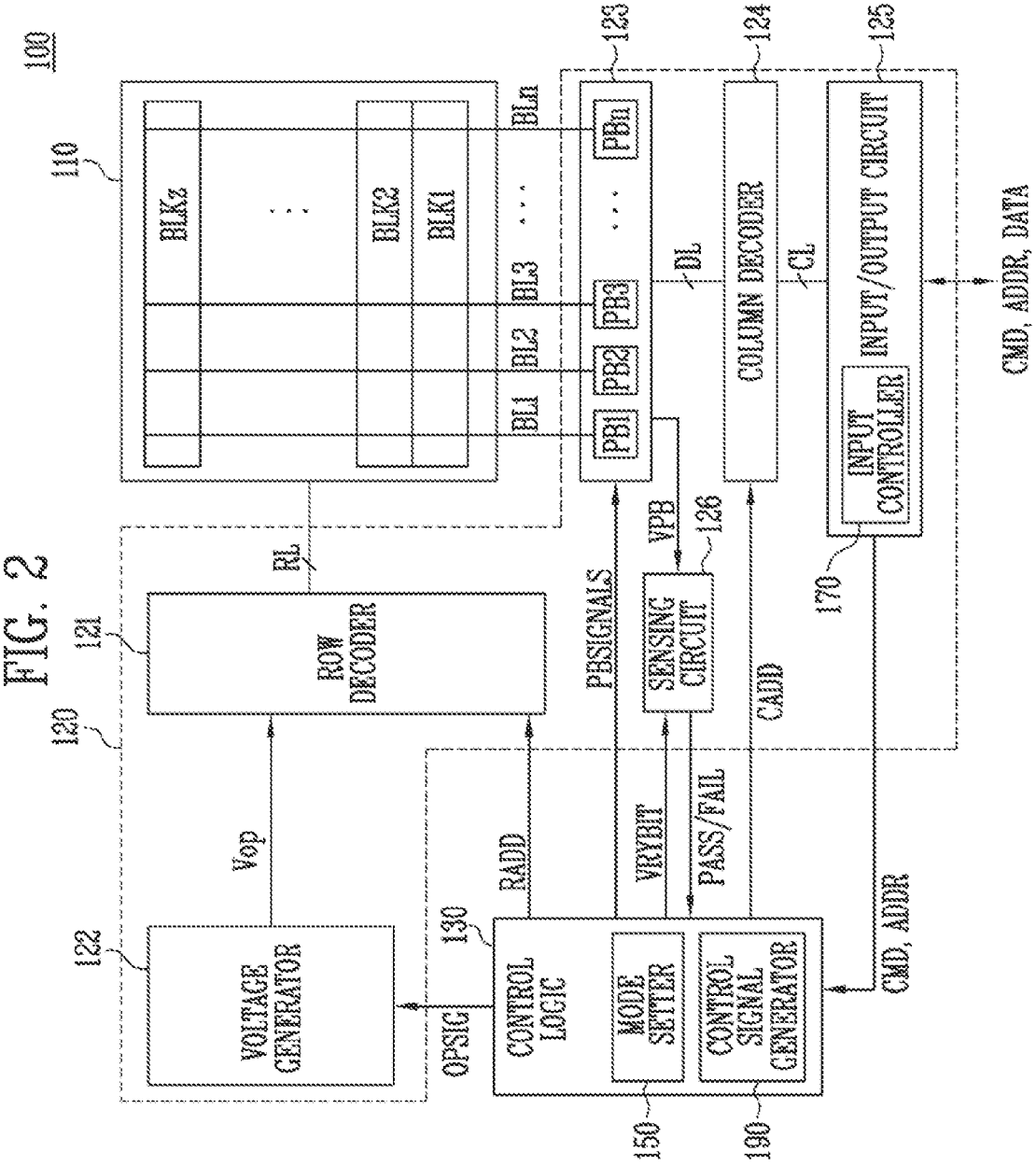
FIG. 2 is a diagram illustrating a structure of a memory device of FIG. 1.

FIG. 2 is a diagram illustrating the structure of the memory device 100 of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to a row decoder 121 through row lines RL. Each of the memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as a single page. Therefore, a single memory block may include a plurality of pages.

The row lines RL may include at least one source select line, a plurality of word lines, and at least one drain select line.

Each of the memory cells included in the memory cell array 110 may be implemented as a single-level cell (SLC) capable of storing one data bit, a multi-level cell (MLC) capable of storing two data bits, a triple-level cell (TLC) capable of storing three data bits, or a quadruple-level cell (QLC) capable of storing four data bits.

The peripheral circuit 120 may perform a program operation, a read operation, or an erase operation on a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 is coupled to the memory cell array 110 through the row lines RL. The row lines RL may include the at least one source select line, the plurality of word lines, and the at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 selects at least one of the memory blocks BLK1 to BLKz according to the decoded address. Further, the row decoder 121 may select at least one word line WL of the selected memory block so that voltages generated by the voltage generator 122 are applied to the at least one word line WL according to the decoded address.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory device 100 is performed on a memory block basis. During an erase operation, the row decoder 121 may select one memory block according to the decoded address. During the erase operation, the row decoder 121 may apply a ground voltage to word lines coupled to the selected memory block.

The voltage generator 122 may be operated under the control of the control logic 130. The voltage generator 122 may generate a plurality of voltages using an external supply voltage provided to the memory device 100. In detail, the voltage generator 122 may generate various operating voltages Vop that are used for program, read, and erase operations in response to an operation signal OPSIG. For example, the voltage generator 122 may generate a program voltage, a verify voltage, a pass voltages, a read voltage, an erase voltage, etc. under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage.

For example, the voltage generator 122 may include a plurality of pumping capacitors for receiving the internal supply voltage and generate a plurality of voltages by selectively enabling the plurality of pumping capacitors under the control of the control logic 130.

The generated voltages may be supplied to the memory cell array 110 by the row decoder 121.

The page buffer group 123 includes first to nth page buffers PB1 to PBn. The first to nth page buffers PB1 to PBn are coupled to the memory cell array 110 through the first to nth bit lines BL1 to BLn. The first to nth page buffers PB1 to PBn are operated under the control of the control logic 130. In detail, the first to nth page buffers PB1 to PBn may be operated in response to page buffer control signals PBSIGNALS. For example, the first to nth page buffers PB1 to PBn may temporarily store data received through the first to nth bit lines BL1 to BLn or may sense voltages or currents of the bit lines BL1 to BLn during a read or verify operation.

In detail, during a program operation, when the program voltage is applied to the selected word line, the first to nth page buffers PB1 to PBn may transfer the data DATA, received through the input/output circuit 125, to selected memory cells through the first to nth bit lines BL1 to BLn. The memory cells in the selected page are programmed based on the received data DATA. During a program verify operation, the first to nth page buffers PB1 to PBn may read page data by sensing the voltages or currents received through the first to nth bit lines BL1 to BLn from the selected memory cells.

During a read operation, the first to nth page buffers PB1 to PBn may read data DATA from the memory cells in the selected page through the first to nth bit lines BL1 to BLn, and may output the read data DATA to the input/output circuit 125 under the control of the column decoder 124.

During the erase operation, the first to nth page buffers PB1 to PBn may allow the first to nth bit lines BL1 to BLn to float or may apply the erase voltage to the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL or may exchange data with the input/output circuit 125 through column lines CL.

The input/output circuit 125 may transfer a command CMD and an address ADDR, received from the memory controller (e.g., 200 of FIG. 1) described above with reference to FIG. 1, to the control logic 130, or may exchange data DATA with the column decoder 124.

During a read operation or a verify operation, the sensing circuit 126 may generate a reference current in response to an enable bit VRYBIT, and may compare a sensing voltage VPB received from the page buffer group 123 with a reference voltage generated by the reference current and then output a pass signal PASS or a fail signal FAIL.

The control logic 130 may control the peripheral circuit 120 by outputting the operation signal OPSIG, the row address RADD, the page buffer control signals PBSIG- NALS, and the enable bit VRYBIT in response to the command CMD and the address ADDR. For example, the control logic 130 may control a read operation on a selected memory block in response to a sub-block read command and an address. Also, the control logic 130 may control an erase operation on a selected sub-block included in a selected memory block in response to a sub-block erase command and an address. In addition, the control logic 130 may determine whether a verify operation has passed or failed in response to the pass signal PASS or the fail signal FAIL. The control logic 130 may be implemented as hardware, software, or a combination of hardware and software. For example, the control logic 130 may be a control logic circuit operating in accordance with an algorithm and/or a processor executing control logic code.

In an embodiment, the control logic 130 may include a mode setter 150 and a control signal generator 190, and the input/output circuit 125 may include an input controller 170. In other embodiments, the mode setter 150 and the control signal generator 190 may be provided outside the control logic 130. In other embodiments, the input controller 170 may be provided outside the input/output circuit 125.

In an embodiment, the mode setter 150 may output a line enable signal TM_X4_MODE to the control signal generator 190, and the control signal generator 190 may output a fast mode signal X4_FASTLOAD for controlling data input to the input controller 170 based on the line enable signal TM_X4_MODE.

In an embodiment, when the memory device 100 is operated in an X8 mode, the line enable signal TM_X4_MODE may be output as a low-state signal to the control signal generator 190, whereas when the memory device is operated in an X4 mode, the line enable signal TM_X4_MODE may be output as a high-state signal to the control signal generator 190. Here, assuming that the total number of input/out lines coupled between the memory device 100 and the memory controller (e.g., 200 of FIG. 1) is 8, the data input mode may be the X8 mode when data is received through all of the input/output lines, and may be the X4 mode when data is received through four input/output lines that are some of all the input/output lines.

In an embodiment, when the control signal generator 190 receives the line enable signal TM_X4_MODE in a high state in the X4 mode, the control signal generator 190 may generate a control signal for generating internal input data based on the data received through some input/output lines. The control signal for generating internal input data may be a fast mode signal X4_FASTLOAD. The fast mode signal X4_FASTLOAD may indicate the input start of data X4_MODE_START and the input end of data X4_MODE_END in the X4 mode.

In an embodiment, the input controller 170 may generate internal input data based on the fast mode signal X4_FASTLOAD. In detail, when data is received from an external controller through some input/output lines in the X4 mode, the input controller 170 may generate the internal input data. The generated internal input data may be programmed to memory cells in a selected page.

Figure 3:
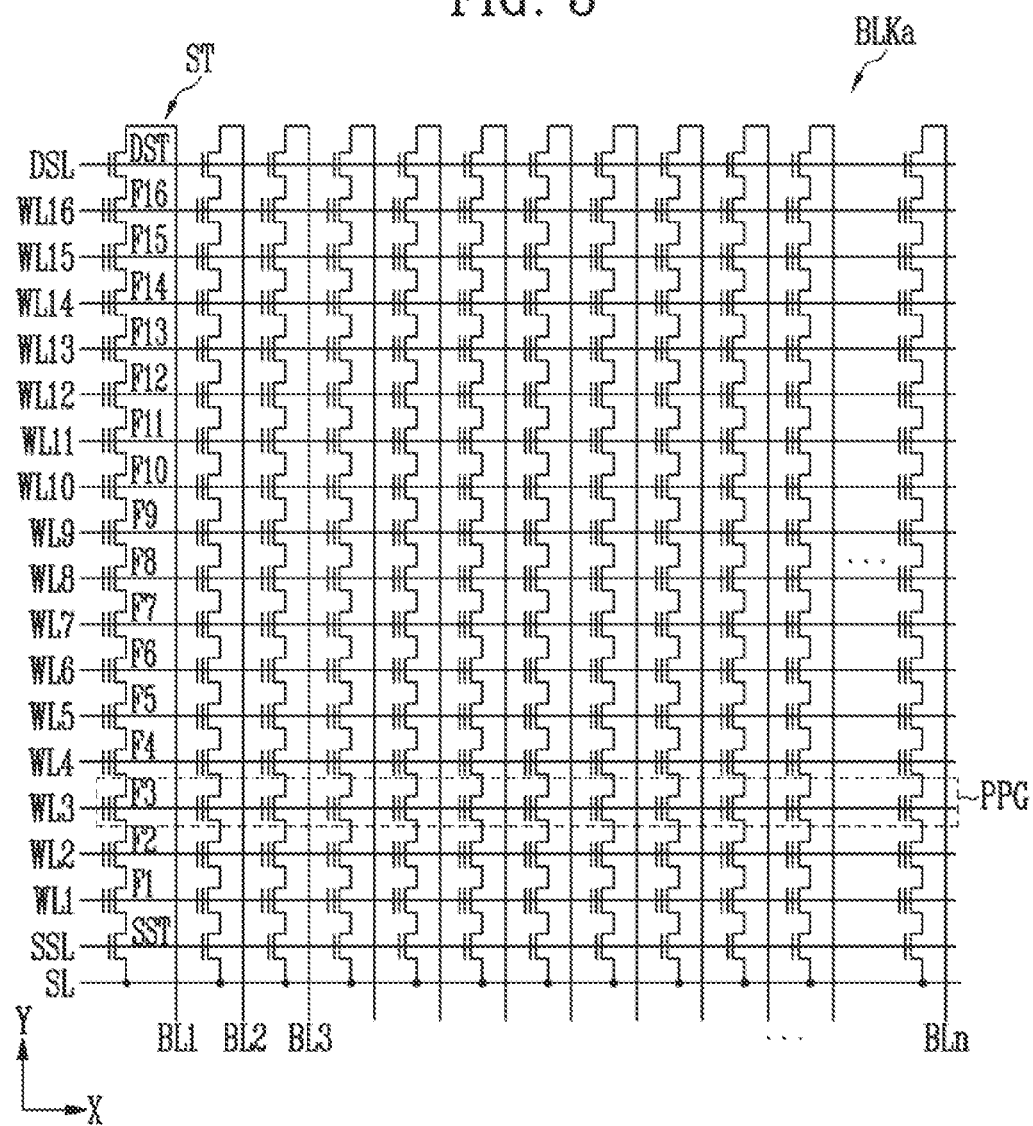
FIG. 3 is a diagram illustrating an embodiment of a memory cell array of FIG. 2.

FIG. 3 is a diagram illustrating an embodiment of the memory cell array of FIG. 2.

Referring to FIGS. 2 and 3, FIG. 3 is a circuit diagram illustrating any one memory block BLKa of a plurality of memory blocks BLK1 to BLKz included in the memory cell array 110 of FIG. 2.

The memory block BLKa may be coupled to a first select line, word lines, and a second select line that are arranged parallel to each other. For example, the word lines may be arranged parallel to each other between the first and second select lines. Here, the first select line may be a source select line SSL, and the second select line may be a drain select line DSL.

In detail, the memory block BLKa may include a plurality of strings coupled between bit lines BL1 to BLn and a source line SL. The bit lines BL1 to BLn may be coupled to the strings, respectively, and the source line SL may be coupled in common to the strings. Because the strings may be equally configured, a string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors included in different strings ST may be coupled to the source select line SSL, gates of the drain select transistors included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKa may include a number of physical pages PPG identical to the number of word lines WL1 to WL16.

One memory cell may store one bit of data. This cell is typically designated as a "single-level cell: SLC". Here, one physical page PPG may store data corresponding to one logical page LPG. The data corresponding to one logical page LPG may include a number of data bits identical to the number of memory cells included in one physical page PPG. Alternatively, one memory cell may store two or more bits of data. This cell is typically designated as a "multi-level cell: MLC". Here, one physical page PPG may store data corresponding to two or more logical pages LPG.

A memory cell in which two or more bits of data are stored is called a multi-level cell (MLC). However, recently, as the number of data bits stored in one memory cell increases, the multi-level cell (MLC) refers to a memory cell in which two bits of data are stored, and thus a memory cell in which three bits of data are stored is called a triple-level cell (TLC) and a memory cell in which four bits of data are stored is called a quadruple-level cell (QLC). In addition, a memory cell scheme in which multiple bits of data are stored has been developed, and the present embodiment may be applied to the memory device 100 in which two or more bits of data are stored.

In an embodiment, each of the memory blocks may have a three-dimensional (3D) structure. Each of the memory blocks may include a plurality of memory cells stacked on a substrate. The plurality of memory cells are arranged in +X, +Y, and +Z directions.

Figure 4:
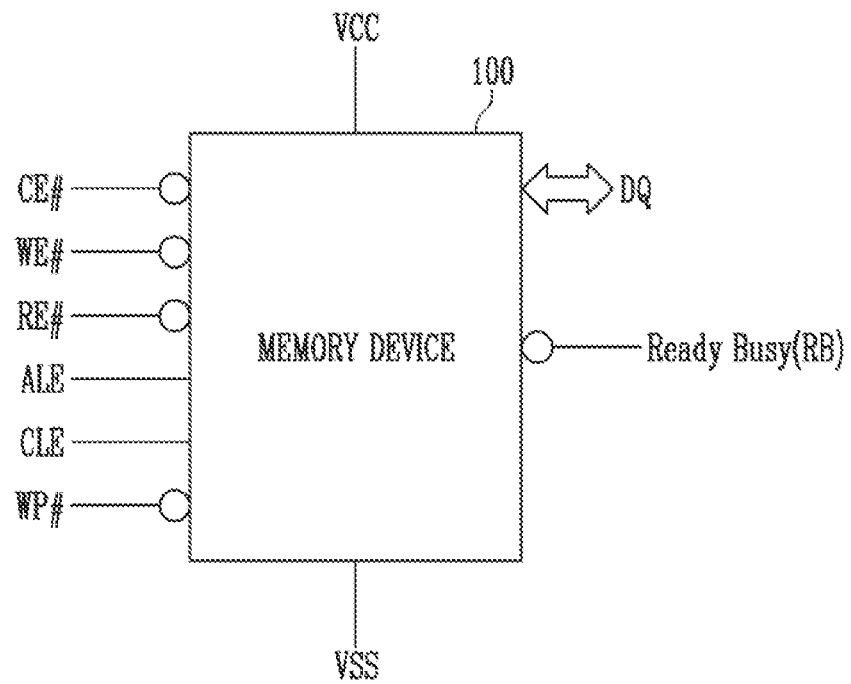
FIG. 4 is a diagram for describing a pin configuration of the memory device of FIG. 1.

FIG. 4 is a diagram for describing the pin configuration of a memory device, for example, the memory device 100 of FIG. 1.

Referring to FIG. 4, the memory device 100 may communicate with an external controller through a plurality of data input/output lines. For example, the memory device 100 may communicate with the external controller through control signal lines which include a chip enable line CE #, a write enable line WE #, a read enable line RE #, an address latch enable line ALE, a command latch enable line CLE, a write protect line WP #, a ready/busy line RB, and data input/output lines DQ.

The memory device 100 may receive a chip enable signal from the external controller through the chip enable line CE #. The memory device 100 may receive a write enable signal from the external controller through the write enable line WE #. The memory device 100 may receive a read enable signal from the external controller through the read enable line RE #. The memory device 100 may receive an address latch enable signal from the external controller through the address latch enable line ALE. The memory device 100 may receive a command latch enable signal from the external controller through the command latch enable line CLE. The memory device 100 may receive a write protect signal from the external controller through the write protect line WP #.

In an embodiment, the memory device 100 may provide the memory controller (e.g., 200 of FIG. 1) with a ready/busy signal, indicating whether the memory device 100 is in a ready state or in a busy state, through the ready/busy line RB.

The chip enable signal may be a control signal for selecting the memory device 100. When the chip enable signal is in a 'high' state and the memory device 100 is in a 'ready' state, the memory device 100 may enter a low-power standby state.

The write enable signal may be a control signal for performing control such that commands, addresses, and input data which are applied to the memory device 100 are stored in a latch.

The read enable signal may be a control signal for enabling the output of serial data.

The address latch enable signal may be one of the control signals used by the host to indicate which one of a command, an address, and data corresponds to the type of signal input to the data input/output lines DQ.

The command latch enable signal may be one of the control signals used by the host to indicate which one of a command, an address, and data corresponds to the type of signal input to the data input/output lines DQ.

For example, when the command latch enable signal is activated (e.g., to a logic high state), the address latch enable signal is deactivated (e.g., to a logic low state), and the write enable signal is activated (e.g., to a logic low state) and then deactivated (e.g., to a logic high state), the memory device 100 may identify that the signal input through the data input/output lines DQ is a command.

For example, when the command latch enable signal is deactivated (e.g., to a logic low state), the address latch enable signal is activated (e.g., to a logic high state), and the write enable signal is activated (e.g., to a logic low state) and then deactivated (e.g., to a logic high state), the memory device 100 may identify that the signal input through the data input/output lines DQ is an address.

The write protect signal may be a control signal for deactivating the program operation and the erase operation that are performed by the memory device 100.

The ready/busy signal may be a signal for identifying the status of the memory device 100. The ready/busy signal in a low state indicates that the memory device 100 is currently performing at least one operation. The ready/busy signal in a high state indicates that the memory device 100 is currently performing no operation.

The ready/busy signal may be in a low state while the memory device 100 is performing any one of a program operation, a read operation, and an erase operation. In an embodiment of the present disclosure, the memory controller 200, described with reference to FIG. 1, may determine a termination time point which is the time point at which the program operation or the erase operation is terminated based on the ready/busy signal.

Figure 5:
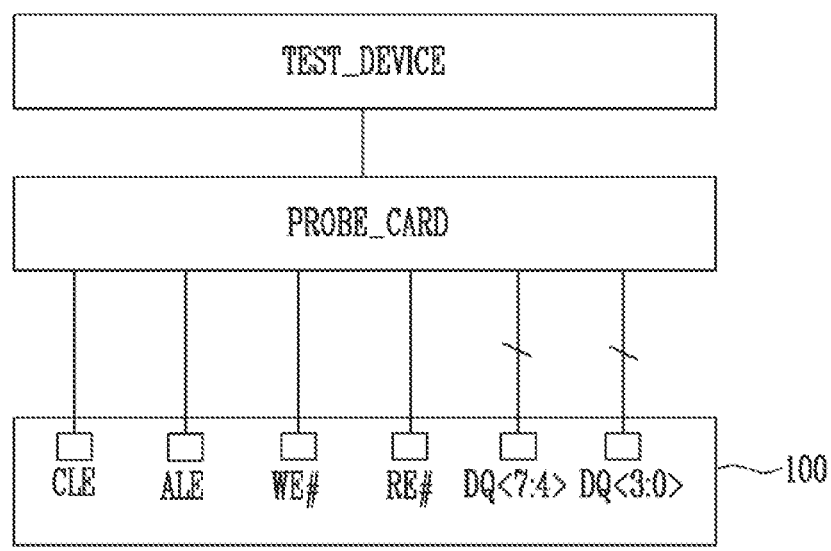
FIG. 5 is a diagram illustrating an embodiment in which a memory device and a test device are coupled to each other during a test operation.

FIG. 5 is a diagram illustrating an embodiment in which a memory device and a test device are coupled to each other during a test operation.

Referring to FIG. 5, a configuration in which a memory device 100 and a test device TEST_DEVICE are coupled to each other through a plurality of lines during a test operation is illustrated in FIG. 5.

In an embodiment, in order to test the memory device 100, the memory device 100 and the test device TEST_DEVICE may be coupled to each other through a probe card PROBE_CARD. For example, the probe card PROBE_CARD transmits electricity while a probe needle mounted on the probe card PROBE_CARD comes into contact with a wafer of the memory device 100, and determines whether the memory device 100 is defective depending on a signal returning from the memory device 100.

Here, the probe card PROBE_CARD and the memory device 100 may be coupled to each other through a plurality of lines.

Referring to FIG. 5, the probe card PROBE_CARD and the memory device 100 may be coupled to each other through a command latch enable line CLE, an address latch enable line ALE, a write enable line WE #, a read enable line RE #, and input/output lines DQ<7:4> and DQ<3:0>.

In FIG. 5, the probe card PROBE_CARD and the memory device 100 may be coupled to each other through all of the input/output lines DQ<7:4> and DQ<3:0>. That is, in the present drawing, the input/output mode of the memory device 100 may be an X8 mode.

However, as the number of dies included in the memory device 100 increases, the number of lines required in order to couple pins of respective dies to the probe card PROBE_CARD may increase. Also, as the number of required lines increases, related costs may also increase.

Therefore, in order to increase test efficiency, there is a need to reduce the number of lines for coupling the pins of respective dies to the probe card PROBE_CARD while setting the input/output mode of the memory device 100 to the X4 mode.

The method of reducing the number of lines for coupling the pins of respective dies to the probe card PROBE_CARD will be described in detail below with reference to FIG. 6.

Figure 6:
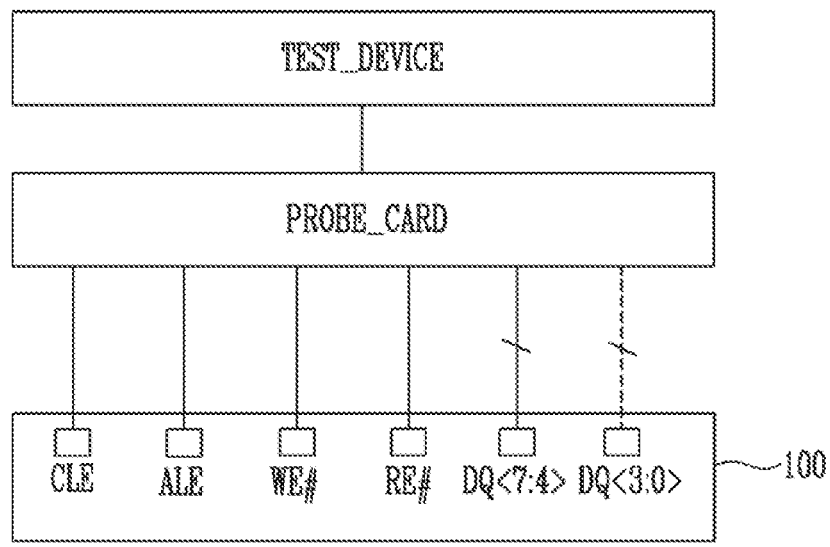
FIG. 6 is a diagram illustrating an embodiment in which a memory device is coupled to a test device during a test operation.

FIG. 6 is a diagram illustrating an embodiment in which a memory device and a test device are coupled to each other during a test operation.

Referring to FIG. 6, a configuration in which a memory device 100 and a test device TEST_DEVICE are coupled to each other through a plurality of lines during a test operation is illustrated in FIG. 6.

In FIG. 6, it is assumed that the memory device 100 is composed of two dies, each of the dies includes a plurality of planes, and each of the planes includes a plurality of memory blocks. That is, the memory device 100 of FIG. 6 may include a first die and a second die, and each of the first and second dies may include a plurality of planes, each including a plurality of memory blocks.

In an embodiment, in order to test the memory device 100, the memory device 100 and the test device TEST_DEVICE may be coupled to each other through a probe card PROBE_CARD. The probe card PROBE_CARD and the memory device 100 may be coupled to each other through a plurality of lines. The plurality of lines may include a command latch enable line CLE, an address latch enable line ALE, a write enable line WE #, a read enable line RE #, and input/output lines DQ<7:4> and DQ<3:0> between the probe card PROBE_CARD and the memory device 100.

However, unlike in FIG. 5, in FIG. 6, the probe card PROBE_CARD and the memory device 100 may be coupled to each other through some lines DQ<7:4> among the input/output lines DQ<7:4> and DQ<3:0>, and the input/output mode of the memory device 100 may be the X4 mode.

In detail, through some lines DQ<7:4> through which upper bits of the data input through the input/output lines are applied, the probe card PROBE_CARD and the memory device 100 may be coupled to each other. In this case, among the dies included in the memory device 100, the first die may be coupled to the probe card PROBE_CARD through some lines DQ<7:4>.

That is, the lines DQ<3:0> through which lower bits of the data are applied might not be coupled to the probe card PROBE_CARD, and the probe card PROBE_CARD and the first die may be coupled to each other through the lines DQ<7:4> through which the upper bits of the data are applied. In this case, the lines DQ<3:0>, which are other lines provided between the probe card PROBE_CARD and the first die and through which lower bits are applied, may be coupled to lines of the second die through which upper bits are applied.

Therefore, because the lines related to the input of a command and an address may be shared between the first and second dies, and the probe card PROBE_CARD, which was coupled only to the first die, is simultaneously coupled both to the first and second dies, the number of lines for coupling the memory device 100 to the probe card PROBE_CARD may be reduced. When the number of lines for coupling the memory device 100 to the probe card PROBE_CARD is reduced, test performance may be improved.

Figure 7:
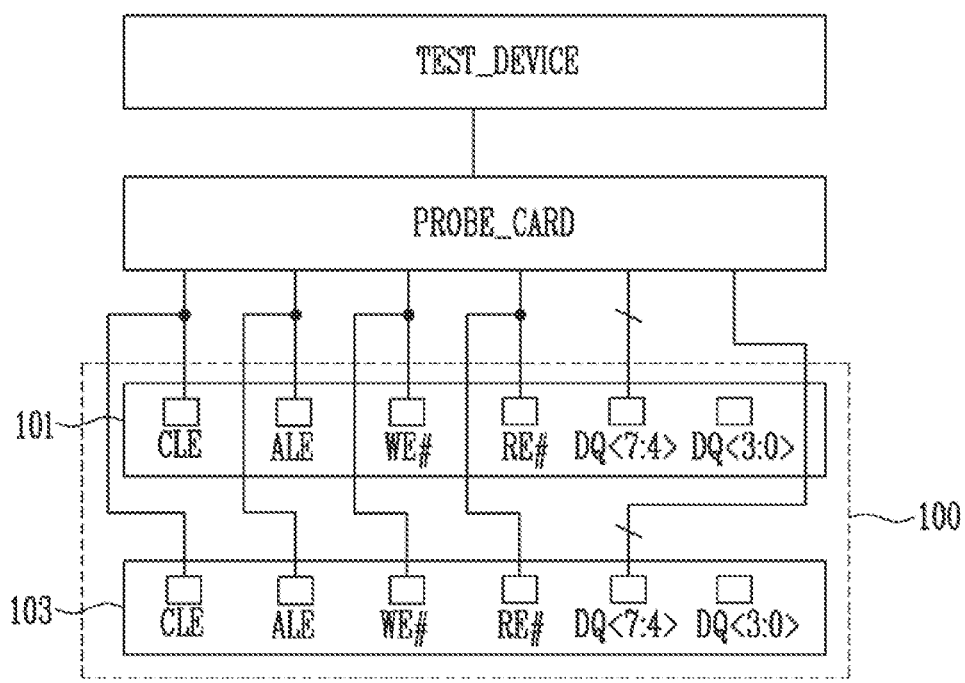
FIG. 7 illustrates a method in which data is input to a plurality of dies during the test operation of FIG. 6.

FIG. 7 illustrates a method in which data is input to a plurality of dies during the test operation of FIG. 6.

Referring to FIGS. 6 and 7, FIG. 7 illustrates lines for coupling a probe card PROBE_CARD and the memory device 100 to each other when the memory device 100 is in an X4 mode. The memory device 100 of FIG. 7 may include a first die 101 and a second die 103, and each of the first and second dies 101 and 103 may include a plurality of planes, each including a plurality of memory blocks.

In an embodiment, when the memory device is in the X4 mode, the first and second dies 101 and 103 may share a command latch enable line CLE, an address latch enable line ALE, a write enable line WE #, and a read enable line RE # which are lines related to the input of a command and an address, with each other. Therefore, the memory device 100 may perform a test operation on the first and second dies 101 and 103 during the test operation.

However, the first die 101 and the probe card PROBE_CARD may be coupled to each other through some lines DQ<7:4> through which upper bits are applied, among the lines through which data is input to the first die 101, and the second die 103 and the probe card PROBE_CARD may be coupled to each other through some lines DQ<7:4> through which upper bits are applied, among the lines through which data is input to the second die 103. Therefore, among the lines through which data is input to the first and second dies 101 and 103, some lines DQ<3:0> through which lower bits are applied might not be used.

In an embodiment, when the memory device 100 is in the X4 mode, the data may be input through some lines DQ<7:4>, and thus the time required for data input may be twice as long as the time required in the case where the memory device 100 is in the X8 mode. For example, a cycle during which one piece of data is input in the X4 mode may be twice a cycle during which one piece of data is input in the X8 mode.

As a result, as the cycle during which data is input increases, the time required for the test operation (test time) may also increase.

Therefore, in the present disclosure, there is presented a method of reducing the test time in the X4 mode by controlling data so that the same test as that performed in the X8 mode is enabled even in the X4 mode.

Figure 8:
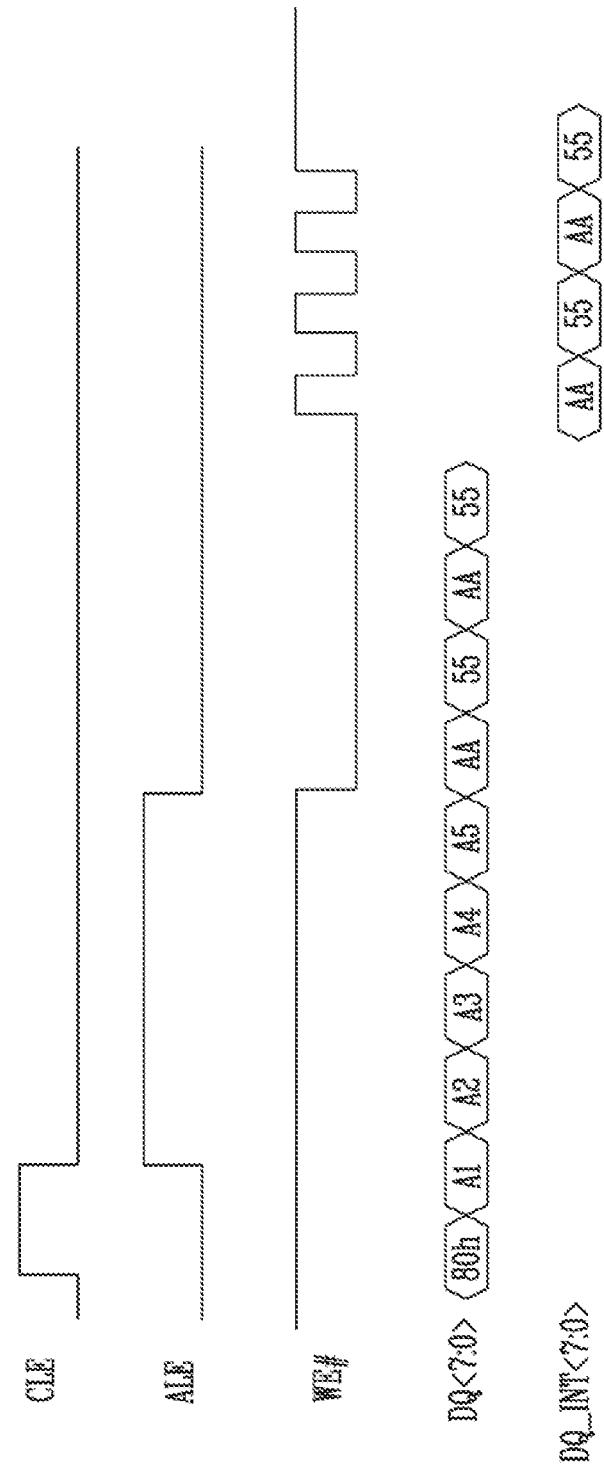
FIG. 8 is a timing diagram illustrating a process in which a command, an address, and data are input in an X8 mode.

FIG. 8 is a timing diagram illustrating a process in which a command, an address, and data are input in an X8 mode.

Referring to FIGS. 5 and 8, signals that are input through a plurality of lines in the input/output mode of FIG. 5 are illustrated in FIG. 8. That is, FIG. 8 illustrates the input of data and internal input data internally generated in a memory device, for example, the memory device 100 of FIG. 5, when the memory device 100 uses all of input/output lines DQ<7:0> at the time of inputting/outputting data in an X8 mode.

In an embodiment, when a program operation is tested during a test operation, the memory device 100 may receive a command latch enable signal from an external controller through the command latch enable line CLE. The command latch enable signal may be a signal indicating that input received through the input/output lines DQ<7:0> is a command. Therefore, when the command latch enable signal received through the command latch enable line CLE is in a high state, the input received through the input/output lines DQ<7:0> may be a command.

As a result, when the command latch enable signal is in a high state, command '80h' may be received from the external controller.

Thereafter, when the reception of the command '80h' is completed, the command latch enable signal may make a transition from a high state to a low state, and an address latch enable signal received through the address latch enable line ALE may make a transition to a high state. Here, the address latch enable signal may be a signal indicating that input received through the input/output lines DQ<7:0> is an address. Therefore, when the address latch enable signal received through the address latch enable line ALE is in a high state, the input received through the input/output lines DQ<7:0> may be an address.

As a result, when the address latch enable signal is in a high state, addresses 'A1', 'A2', 'A3', 'A4', and 'A5' may be received from the external controller.

Thereafter, when the reception of the addresses 'A1', 'A2', 'A3', 'A4', and 'A5' is completed, the address latch enable signal makes a transition from a high state to a low state, and a write enable signal received from the external controller through the write enable line WE # may make a transition from a high state to a low state. When the write enable signal makes a transition to a low state, the memory device 100 may receive data through the input/output lines DQ<7:0>. For example, when the write enable signal is in a low state, pieces of data 'AA', '55', 'AA', and '55' may be received through the input/output lines DQ<7:0>.

Here, because the pieces of data are received using all of the input/output lines DQ<7:0> coupled to the memory device 100, the externally received data may be equally output as Internal input data DQ_INT<7:0>, without being subjected to separate data control in the memory device 100. That is, the pieces of data received through the input/output lines DQ<7:0> may be programmed, as the internal input data DQ_INT<7:0>, to memory cells.

Figure 9:
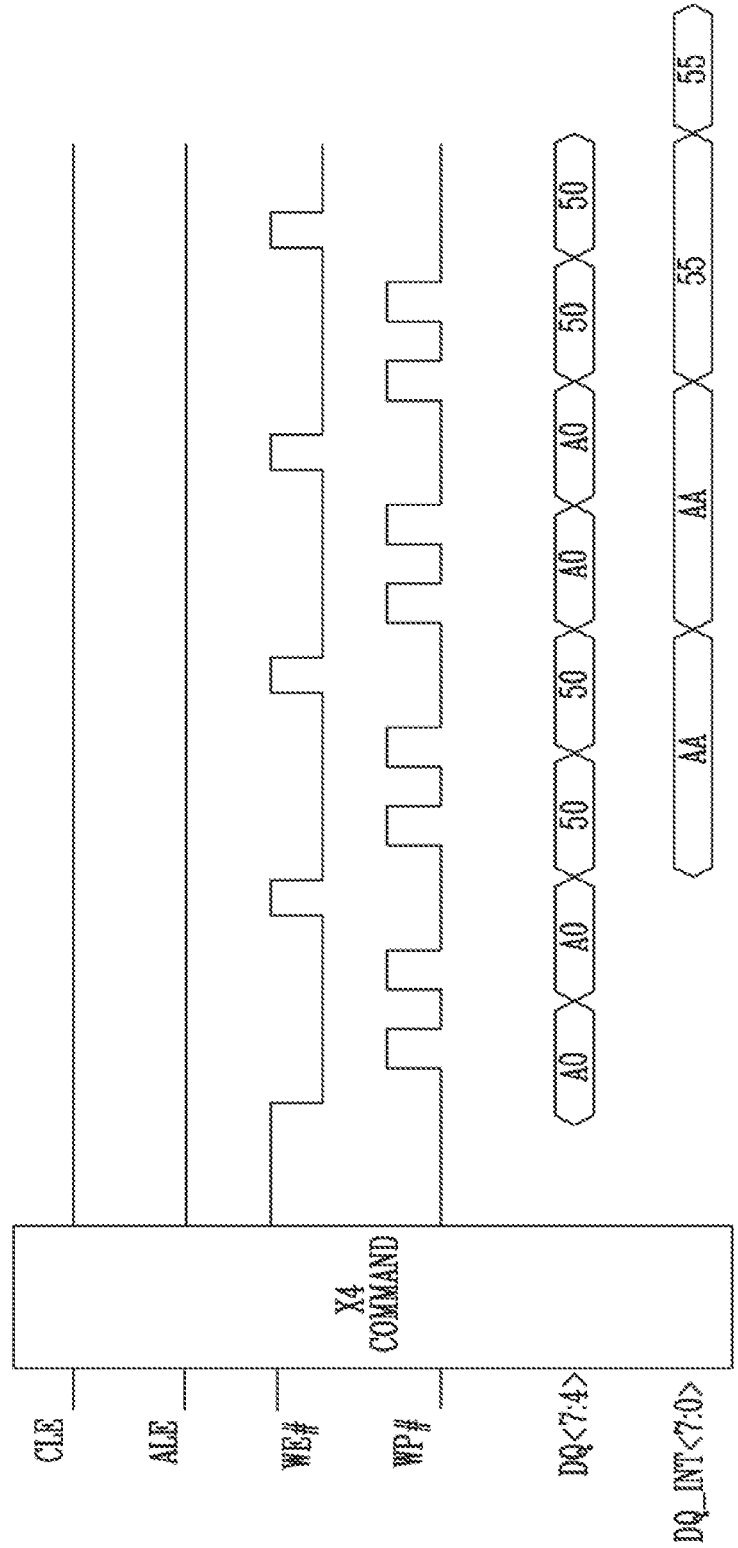
FIG. 9 is a timing diagram illustrating a process in which data is input in an X4 mode.

FIG. 9 is a timing diagram illustrating a process in which data is input in an X4 mode.

Referring to FIGS. 6 and 9, FIG. 9 illustrates signals that are input through a plurality of lines when a memory device, for example, the memory device 100 of FIG. 6, receives data from an external controller in the input/output mode of FIG. 6. That is, FIG. 9 illustrates the input of data and internal input data DQ_INT<7:0> internally generated in the memory device 100 when the memory device 100 uses some of the input/output lines DQ<7:0> in an X4 mode.

Referring to FIGS. 8 and 9, in FIG. 9, when the memory device 100 receives a command and an address, it is operated in an X8 mode in which all input/output lines DQ<7:0> are used in the same way as that of FIG. 8, and thus a detailed description thereof will be omitted.

In an embodiment, the memory device 100 may receive data from an external controller when a write enable signal received through a write enable line WE # is in a low state. Here, the memory device 100 may receive data through some input/output lines DQ<7:4> through which upper bits are applied, among the input/output lines DQ<7:0>. Therefore, among the input/output lines DQ<7:0>, some input/output lines DQ<3:0> through which lower bits are applied might not be used.

Further, when a write protect signal received through a write protect line WP # is in a low state, the memory device 100 may receive data through some input/output lines DQ<7:4> through which upper bits are applied, among the input/output lines DQ<7:0>.

Because the data is received through some input/output lines DQ<7:4>, among the input/output lines DQ<7:0>, pieces of data 'A', 'A', '5', '5', 'A', 'A', '5', and '5' may be received through the input/output lines DQ<7:4> in the case where the write enable signal is in a low state when the memory device 100 is operated in the X4 mode. That is, because some input/output lines DQ<3:0> through which lower bits are applied are not used, pieces of data 'A', 'A', '5', '5', 'A', 'A', '5', and '5' or pieces of data 'A0', 'A0', '50', '50', 'A0', 'A0', '50', and '50' may be received.

In this case, because the data is received through some input/output lines DQ<7:4>, among all of the input/output lines DQ<7:0>, the time required to receive the data may be twice as long as the time required in FIG. 8. For example, when data is received through some input/output lines DQ<7:4>, pieces of data 'A0', 'A0', '50', and '50' may be received during a first cycle and data 'A0', 'A0', '50', and '50' may be received during a second cycle. That is, data that can be received through all of the input/output lines DQ<7:0> during one cycle may be received through some input/output lines DQ<7:4> during two cycles.

In an embodiment, the memory device 100 may generate internal input data DQ_INT<7:0> by internally combining the pieces of data 'A0', 'A0', '50', '50', 'A0', 'A0', '50', and '50' received through some input/output lines DQ<7:4>. For example, the memory device 100 may generate data 'AA' by combining 'A0' with 'A0', and may generate data '55' by combining '50' with '50'. The generated data may be programmed to the memory cells of the memory device 100.

Figure 10:
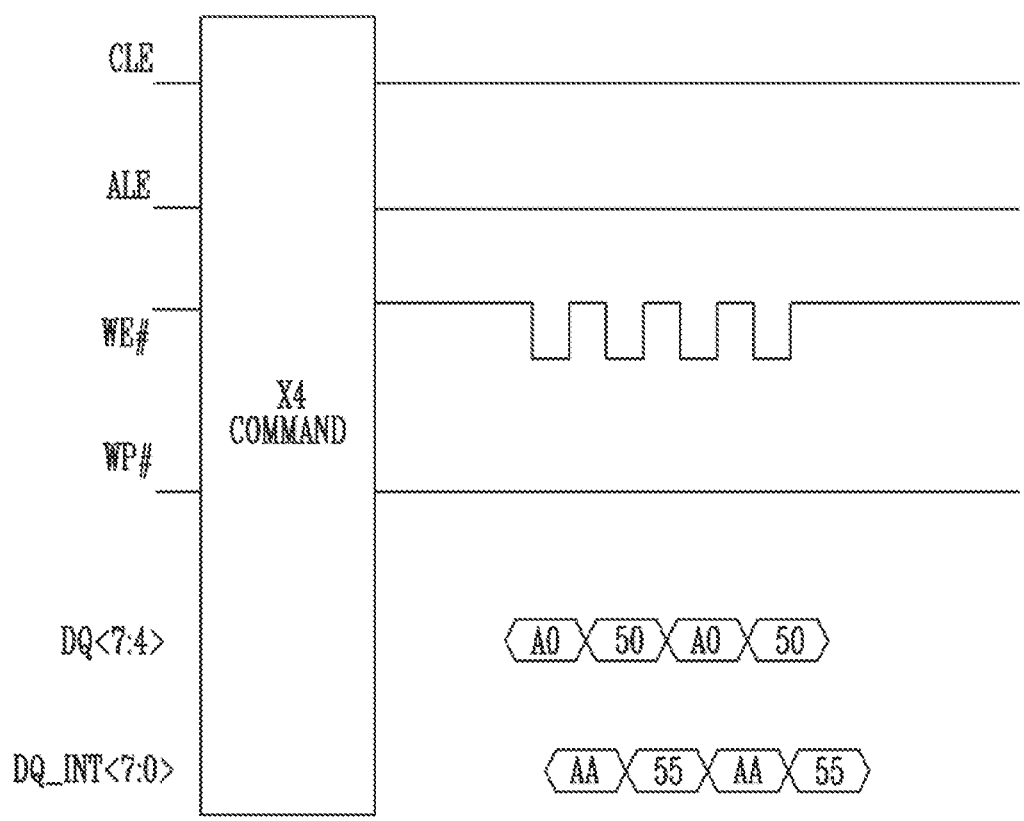
FIG. 10 illustrates a method of reducing a data input time in an X4 mode.

FIG. 10 illustrates a method of reducing a data input time in an X4 mode.

Referring to FIGS. 6 and 10, FIG. 10 illustrates signals that are input through a plurality of lines when a memory device, for example, the memory device 100 of FIG. 6, receives data from an external controller in the input/output mode of FIG. 6. That is, FIG. 10 illustrates the input of data and internal input data DQ_INT<7:0> internally generated in the memory device 100 when the memory device 100 uses some of the input/output lines DQ<7:0> in the X4 mode.

However, unlike in FIG. 9, in the present drawing, the memory device 100 may receive all data during one cycle in the X4 mode.

In FIG. 9, because data is received through some input/output lines DQ<7:4>, among the input/output lines DQ<7:0>, a data input cycle may be lengthened when the memory device 100 is operated in the X4 mode. That is, data that can be received during one cycle through all of the input/output lines DQ<7:0> may be received during two cycles through some input/output lines DQ<7:4>. In detail, while a write enable signal received from the external controller through a write enable line WE # is in a low state, pieces of data 'A0', 'A0', '50', and '50' may be received through some input/output lines DQ<7:4> during one cycle. Here, '0' may mean that no data is input.

However, in the present drawing, even if data has been received through some input/output lines DQ<7:4>, the memory device 100 may internally generate input data based on the received data. For example, the memory device 100 may generate internal input data DQ_INT<7:0>, such as 'AA', 'AA', '55', and '55', based on the pieces of data 'A0', 'A0', '50', and '50' received through some input/output lines DQ<7:4>.

In an embodiment, when the memory device 100 internally generates input data, the same effect as when data is received through all input/output lines DQ<7:0> may be obtained even if data is received through only some input/output lines DQ<7:4> during one cycle.

The method of generating the internal input data DQ_INT<7:0> based on the data received through some input/output lines DQ<7:4> will be described below with reference to the following drawings.

Figure 11:
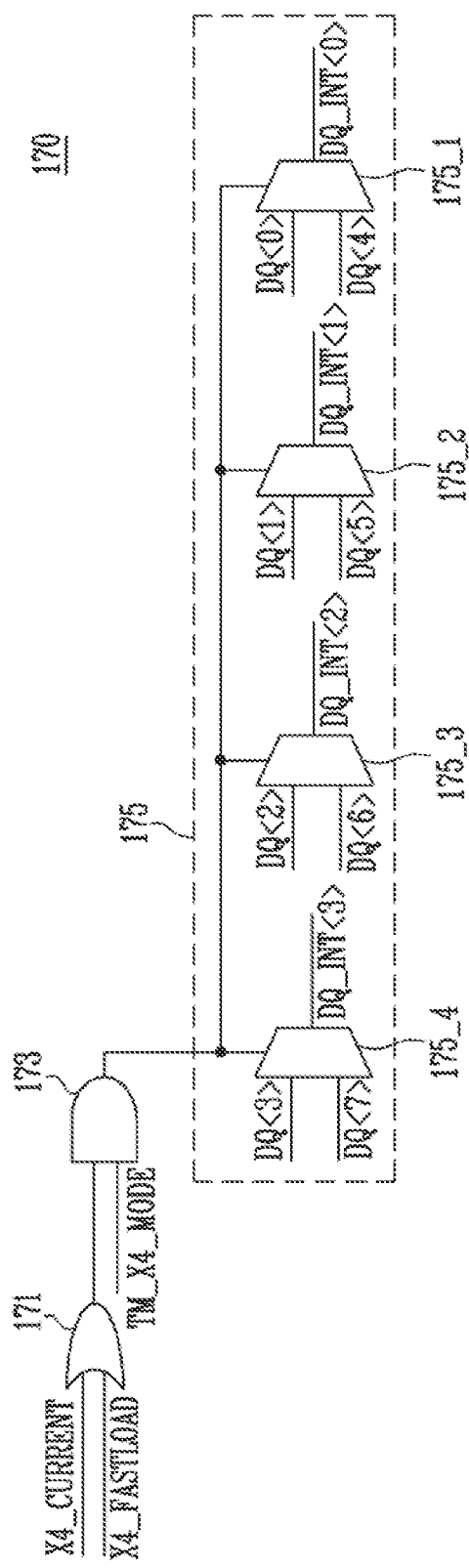
FIGS. 11A to 11C illustrate methods in which data is input in an X4 mode and an X8 mode.

FIGS. 11A to 11C illustrate methods in which data is input in an X4 mode and an X8 mode.

Referring to FIGS. 11A to 11C, FIG. 11A illustrates the configuration of the input controller of FIG. 1 (e.g., 170 of FIG. 1), FIG. 11B illustrates internal input data DQ_INT<7:0> generated by the input controller 170 when a command or an address is input in the X4 mode, and FIG. 11C illustrates internal input data DQ_INT<7:0> generated by the input controller 170 when data is input in the X4 mode.

In an embodiment, the input controller 170 may include a first gate 171, a second gate 173, and a multiplexer component 175. The multiplexer component 175 may include first to fourth multiplexers 175_1 to 175_4. The first gate 171 may be an OR gate (i.e., a logical OR gate), and the second gate 173 may be an AND gate (i.e., a logical AND gate).

In an embodiment, a normal mode signal X4_CURRENT and a fast mode signal X4_FASTLOAD may be input to the first gate 171. The normal mode signal X4_CURRENT may make a transition from a high state to a low state when a memory device, for example, the memory device 100, receives a command or an address from an external controller in the X4 mode. Also, the fast mode signal X4_FASTLOAD may make a transition from a low state to a high state when the memory device 100 receives data from the external controller in the X4 mode.

In an embodiment, when the normal mode signal X4_CURRENT in a high state and/or the fast mode signal X4_FASTLOAD in a high state are input, the first gate 171 may output a high-state signal, whereas when the normal mode signal X4_CURRENT in a low state and the fast mode signal X4_FASTLOAD in a low state are input, the first gate 171 may output a low-state signal.

The high-state signal or the low-state signal output from the first gate 171 may be input to the second gate 173. The signal output from the first gate 171 and a line enable signal TM_X4_MODE may be input to the second gate 173. The line enable signal TM_X4_MODE may be output from the mode setter 150 of FIG. 1.

For example, when the memory device 100 is operated in the X8 mode, the line enable signal TM_X4_MODE may be input as a low-state signal, whereas when the memory device 100 is operated in the X4 mode, the line enable signal TM_X4_MODE may be input as a high-state signal. Therefore, when the memory device 100 is operated in the X4 mode, the line enable signal TM_X4_MODE may be in a high state.

In an embodiment, when the normal mode signal X4_CURRENT in a low state is input to the first gate 171, the externally received command or address may be output without change in the X4 mode. Further, when the fast mode signal X4_FASTLOAD in a high state is input to the first gate 171, new internal input may be output based on externally received data.

In detail, when a command or an address is received in the X4 mode, the line enable signal TM_X4_MODE is in a high state, the normal mode signal X4_CURRENT is in a low state, and the fast mode signal X4_FASTLOAD is in a low state, and thus a low-state signal may be output from the first gate 171. Because the signal output from the first gate 171 is a low-state signal, a low-state signal may be output from the second gate 173 even if the line enable signal TM_X4_MODE is in a high state. The low-state signal output from the second gate 173 may be input to the first to fourth multiplexers 175_1 to 175_4.

When the low-state signal output from the second gate 173 is input to the first to fourth multiplexers 175_1 to 1754, the multiplexer component 175 might not output the internal input data DQ_INT<3:0>. That is, when the memory device 100 receives a command or an address through some input/output lines DQ<7:4> in the X4 mode, the remaining lines DQ<3:0> other than some input/output lines DQ<7:4> might not be used, and the command or the address received through some input/output lines DQ<7:4> may be equally output as the internal input data DQ_INT<7:4> without being subjected to separate control.

Referring to FIG. 11B, the internal input data DQ_INT<7:0>, output from the first to fourth multiplexers 175_1 to 175_4 when the line enable signal TM_X4_MODE is in a low state and the normal mode signal X4_CURRENT and the fast mode signal X4_FASTLOAD are in a low state, is illustrated. That is, the internal input data DQ_INT<3:0> might not be generated, and the data received through some input/output lines DQ<7:4> may be output as the internal input data DQ_INT<7:4> without change.

Also, when data is received in the X4 mode, the line enable signal TM_X4_MODE is in a high state, the normal mode signal X4_CURRENT is in a high state, and the fast mode signal X4_FASTLOAD is in a high state, and thus a high-state signal may be output from the first gate 171. Because the signal output from the first gate 171 is in a high state and the line enable signal TM_X4_MODE is in a high state, a high-state signal may be output from the second gate 173. The high-state signal output from the second gate 173 may be input to the first to fourth multiplexers 175_1 to 175_4.

When the high-state signal output from the second gate 173 is input to the first to fourth multiplexers 175_1 to 175_4, the memory device 100 may generate internal input data DQ_INT<3:0> based on the data received through some input/output lines DQ<7:4>. Here, the remaining lines DQ<3:0> other than the some input/output lines DQ<7:4> might not be used.

For example, internal input data DQ_INT<0> may be generated based on DQ<0> and DQ<4> that are input to the first multiplexer 175_1 (MUX(DQ<0>, DQ<4>). Here, the first multiplexer 1751 may select DQ<4> between DQ<0> and DQ<4>, and may then output DQ<4> as the internal input data DQ_INT<0>.

Similarly, the second multiplexer 175_2 may select DQ<5> between input DQ<1> and input DQ<5> and output DQ<5> as internal input data DQ_INT<1> (MUX(DQ<1>, DQ<5>), the third multiplexer 175_3 may select DQ<6> between input DQ<2> and input DQ<6> and output DQ<6> as internal input data DQ_INT<2> (MUX(DQ<2>, DQ<6>), and the fourth multiplexer 1754 may select DQ<7> between input DQ<3> and input DQ<7> and may output DQ<7> as internal input data DQ_INT<3> (MUX (DQ<3>, DQ<7>).

Referring to FIG. 11C, the internal input data, output from the first to fourth multiplexers 175_1 to 175_4 when the line enable signal TM_X4_MODE is in a high state and the normal mode signal X4_CURRENT and the fast mode signal X4_FASTLOAD are in a high state, is illustrated. That is, although the remaining lines DQ<3:0> other than some input/output lines DQ<7:4> are not used, the internal input data DQ_INT<3:0> may be output from the first to fourth multiplexers 175_1 to 175_4, and the data received through some input/output lines DQ<7:4> may be output as the internal input data DQ_INT<7:4>.

Therefore, although the memory device 100 receives data through some input/output lines DQ<7:4> in the X4 mode, data having the same size as that when being operated in the X8 mode may be input in the same cycle as that in the X8 mode.

In other embodiments, when a memory device, for example, the memory device 100 of FIG. 6, is operated in the X8 mode, the line enable signal TM_X4_MODE may be in a low state. Therefore, regardless of the states of the normal mode signal X4_CURRENT and the fast mode signal X4_FASTLOAD, a low-state signal may be output from the second gate 173. Further, when the low-state signal output from the second gate 173 is input to the first to fourth multiplexers 175_1 to 175_4, the multiplexer component 175 might not output the internal input data DQ_INT<3:0>. Furthermore, in the X8 mode, the internal input data DQ_INT<7:0> might not be generated, and the memory device 100 may output data received through the input/output lines DQ<7:0> without change.

Figure 12:
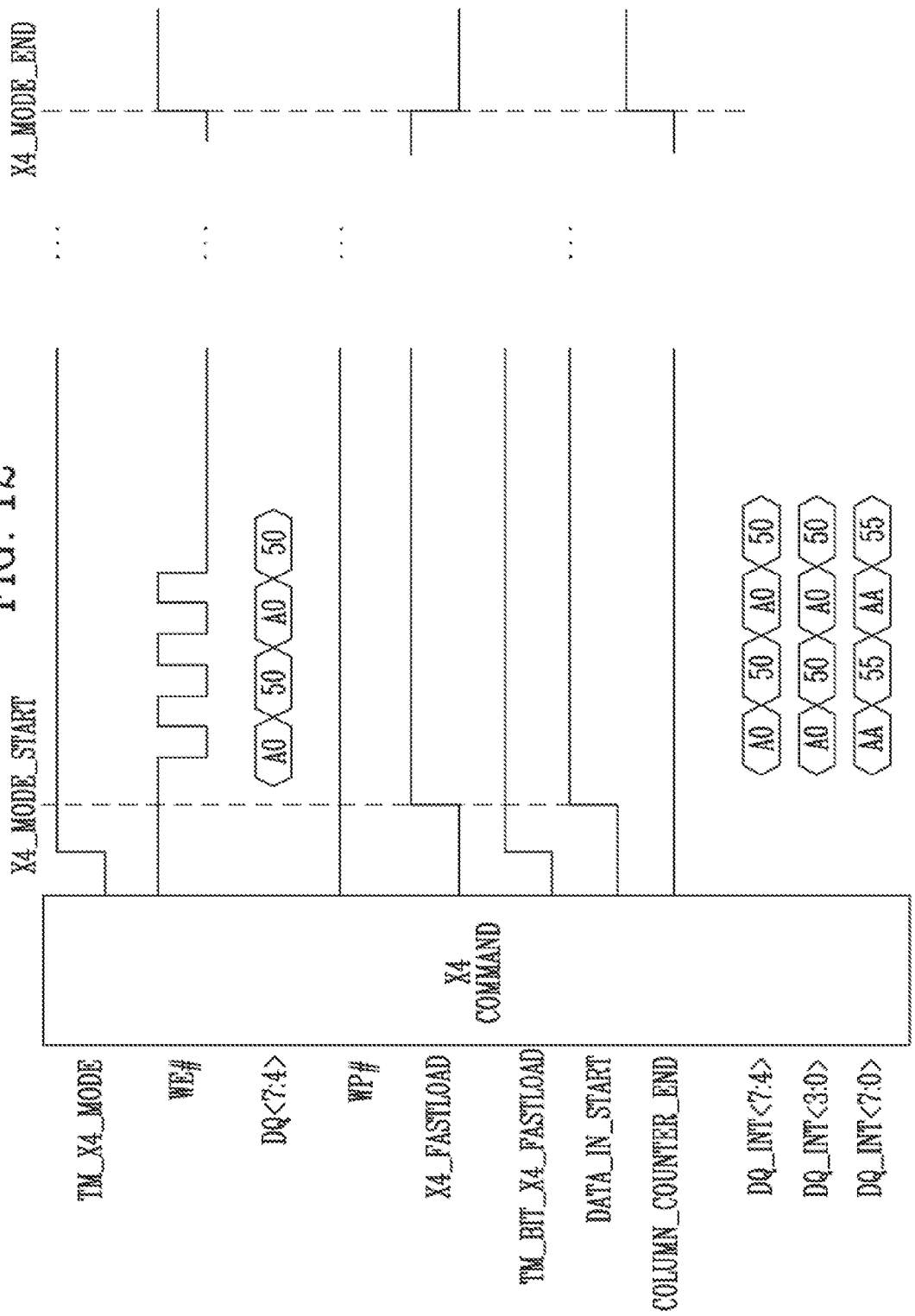
FIG. 12 illustrates control signals required for data input and generated internal input data in an X4 mode.

FIG. 12 illustrates control signals used for data input and generated internal input data in an X4 mode.

Referring to FIG. 12, a line enable signal TM_X4_MODE that is used to set the input mode of a memory device, for example, the memory device 100, to an X4 mode or an X8 mode, a write enable signal that is input through a write enable line WE #, data input DQ<7:0> that is input through data input/output lines DQ, a write protect signal that is input through a write protect line WP #, a fast mode signal X4_FASTLOAD that indicates the input start and input end of data in the X4 mode, a first control signal TM_BIT_X4_FASTLOAD that is used to generate the fast mode signal X4_FASTLOAD, a second control signal DATA_IN_START, a third control signal COLUMN_COUNTER_END, and internal input data DQ_INT<7:4> that is output from an input controller (e.g., 170 of FIG. 1) are illustrated in FIG. 12.

In FIG. 12, it is assumed that the memory device 100 receives data from an external controller in the X4 mode. Here, the X4 mode may be a mode in which input is received from the external controller using only some of a greater number of input/output lines coupled to the memory device 100, and the X8 mode may be a mode in which input is received from the external controller using all of the input/output lines coupled to the memory device 100.

In an embodiment, when the memory device 100 initiates operation in the X4 mode, the line enable signal TM_X4_MODE may make a transition from a low state to a high state. The line enable signal TM_X4_MODE may be output from the mode setter 150 of FIG. 1.

When the memory device 100 initiates operation in the X4 mode, data may be received through some input/output lines DQ<7:4> when the write protect signal that is input through the write protect line WP # is in a low state. In the present drawing, because the memory device 100 receives data from the external controller in the X4 mode, pieces of data 'A0', '50', 'A0', and '50' may be received through some input lines DQ<7:4>. The write protect signal that is input through the write protect line WP # while the data is input through some input/output lines DQ<7:4> may be in a high state.

In an embodiment, the fast mode signal X4_FASTLOAD may indicate the input start of data X4_MODE_START and the input end of data X4_MODE_END in the X4 mode. In an embodiment, the fast mode signal X4_FASTLOAD may be generated based on the first control signal TM_BIT_X4_FASTLOAD, the second control signal DATA_IN_START, and the third control signal COLUMN_COUNTER_END.

In detail, the first control signal TM_BIT_X4_FASTLOAD may make a transition from a low state to a high state when the input of data is started in the X4 mode. For example, in the present disclosure, when the memory device 100 internally generates input data in the X4 mode, that is, when the input of data for allowing the input controller 170 to output the internal input data DQ_INT<7:0> is started, the first control signal TM_BIT_X4_FASTLOAD may make a transition from a low state to a high state.

The second control signal DATA_IN_START may make a transition from a low state to a high state when a data input command for instructing the input of data is received from the external controller.

The third control signal COLUMN_COUNTER_END may make a transition from a low state to a high state when the input of data is terminated in the X4 mode. For example, the third control signal COLUMN_COUNTER_END may make a transition to a high state when the last column of page data has been reached at the time of inputting or outputting data.

In an embodiment, the fast mode signal X4_FASTLOAD may be generated based on the above-described first control signal TM_BIT_X4_FASTLOAD, second control signal DATA_IN_START, and third control signal COLUMN_COUNTER_END. In detail, when the first control signal TM_BIT_X4_FASTLOAD is in a high state, the fast mode signal X4_FASTLOAD may be enabled by making a transition to a high state on the rising edge of the second control signal DATA_IN_START, and may be disabled by making a transition to a low state on the rising edge of the third control signal COLUMN_COUNTER_END. Therefore, the fast mode signal X4_FASTLOAD may indicate the input start of data X4_MODE_START and the input end of data X4_MODE_END in the X4 mode.

In an embodiment, when the fast mode signal X4_FASTLOAD makes a transition from a low state to a high state, data may be received through some input/output lines DQ<7:4>. Here, the remaining input/output lines DQ<3:0> other than some input/output lines DQ<7:4> might not be used. Alternatively, even if data has been input through the input/output lines DQ<3:0>, the corresponding data may be ignored.

Therefore, based on the data received through some input/output lines DQ<7:4>, the internal input data DQ_INT<7:0> may be output from the input controller (e.g., 170 of FIG. 1). For example, although pieces of data 'A0', '50', 'A0', and '50' are actually received through some input/output lines DQ<7:4>, the internal input data DQ_INT<7:0> may be 'AA', '55', 'AA', and '55'.

Consequently, although data is input through some input/output lines DQ<7:4> in the X4 mode, data having the same size as that when being operated in the X8 mode may be input in the same cycle as that in the X8 mode. Therefore, in the X4 mode, a data input speed may be improved.

Figure 13:
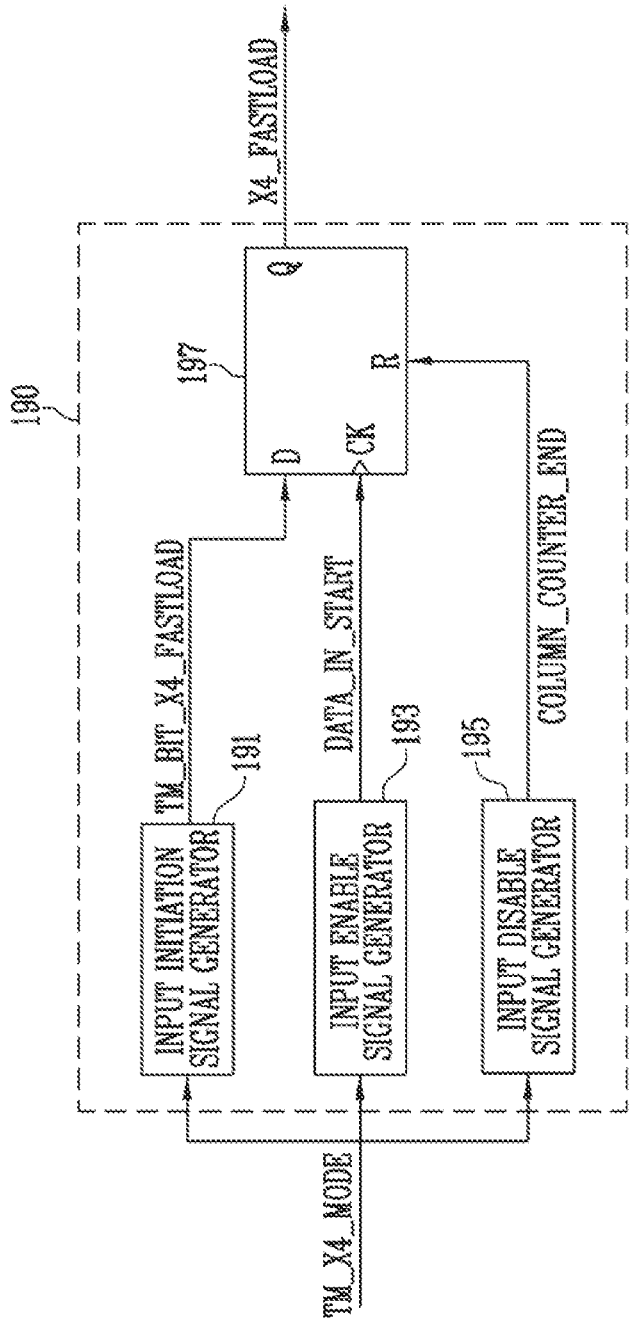
FIG. 13 illustrates the configuration of a control signal generator for generating a fast mode signal of FIG. 12.

FIG. 13 illustrates the configuration of a control signal generator 190 for generating the fast mode signal of FIG. 12.

Referring to FIG. 13, the control signal generator 190 of FIG. 13 may include an input initiation signal generator 191, an input enable signal generator 193, an input disable signal generator 195, and a D flip-flop 197. In FIG. 13, the control signal generator 190 may output the fast mode signal X4_FASTLOAD based on a line enable signal TM_X4_MODE received from the mode setter 150 of FIG. 1.

In an embodiment, the control signal generator 190 may receive the line enable signal TM_X4_MODE from the mode setter 150 of FIG. 1. When the memory device (e.g., 100 of FIG. 6) initiates operation in the X4 mode, the line enable signal TM_X4_MODE may make a transition from a low state to a high state. When the line enable signal TM_X4_MODE is received, the line enable signal TM_X4_MODE may be transferred to the input initiation signal generator 191, the input enable signal generator 193, and the input disable signal generator 195.

In an embodiment, the input initiation signal generator 191 may generate a first control signal TM_BIT_X4_FASTLOAD based on the line enable signal TM_X4_MODE in a high state. The generated first control signal TM_BIT_X4_FASTLOAD may be input to an input pin D of the D flip-flop 197.

The first control signal TM_BIT_X4_FASTLOAD output from the input initiation signal generator 191 may make a transition from a low state to a high state when the input of data for allowing the input controller 170 to output the internal input data DQ_INT<7:0> is started in the X4 mode.

In an embodiment, the input enable signal generator 193 may generate a second control signal DATA_IN_START based on the line enable signal TM_X4_MODE in a high state. The generated second control signal DATA_IN_START may be input to a clock pin CK of the D flip-flop 197.

The second control signal DATA_IN_START output from the input enable signal generator 193 may make a transition from a low state to a high state when a data input command for instructing the input of data is received from the external controller.

In an embodiment, the input disable signal generator 195 may generate a third control signal COLUMN_COUNTER_END based on the line enable signal TM_X4_MODE in a high state. The generated third control signal COLUMN_COUNTER_END may be input to a reset pin R of the D flip-flop 197.

The third control signal COLUMN_COUNTER_END output from the input disable signal generator 195 may make a transition to a high state when the last column of page data has been reached at the time of inputting or outputting data in the X4 mode.

In an embodiment, the D flip-flop 197 may output the fast mode signal X4_FASTLOAD through an output pin Q based on the first control signal TM_BIT_X4_FASTLOAD that is input through the input pin D.

In detail, when the first control signal TM_BIT_X4_FASTLOAD is input through the input pin D of the D flip-flop 197, the fast mode signal X4_FASTLOAD may be enabled on the rising edge of the second control signal DATA_IN_START that is input through the clock pin CK. That is, on the rising edge of the second control signal DATA_IN_START, the first control signal TM_BIT_X4_FASTLOAD may make a transition from a low state to a high state.

Thereafter, when the third control signal COLUMN_COUNTER_END is input through the reset pin R of the D flip-flop 197, the fast mode signal X4_FASTLOAD may be disabled on the rising edge of the third control signal COLUMN_COUNTER_END. That is, on the rising edge of the third control signal COLUMN_COUNTER_END, the fast mode signal X4_FASTLOAD may make a transition from a low state to a high state.

Consequently, because the fast mode signal X4_FASTLOAD is generated based on the first control signal TM_BIT_X4_FASTLOAD, the second control signal DATA_IN_START, and the third control signal COLUMN_COUNTER_END, the fast mode signal X4_FASTLOAD may indicate the input start of data X4_MODE_START and the input end of data X4_MODE_END in the X4 mode.

Figure 14:
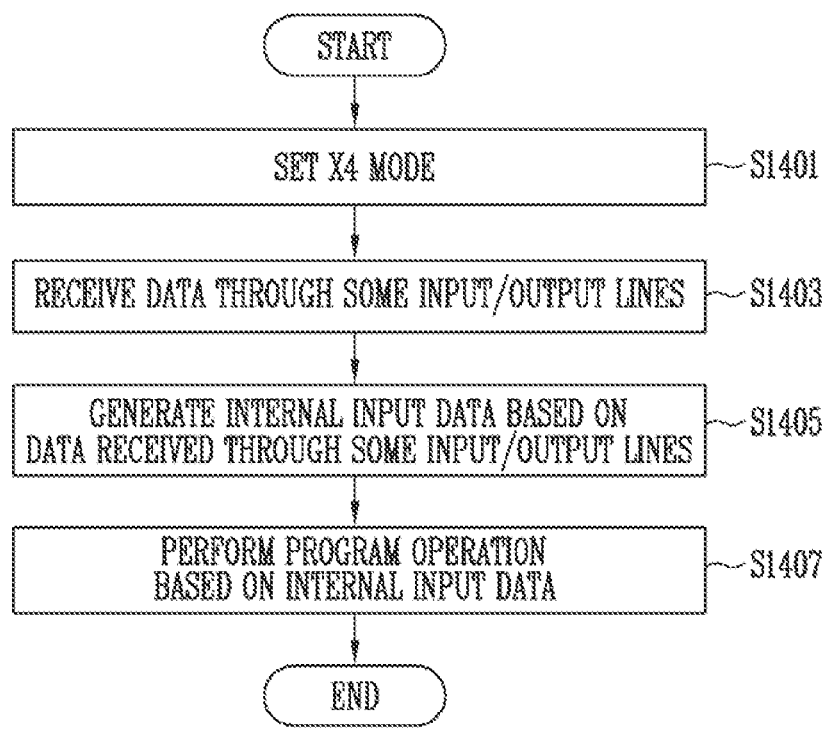
FIG. 14 is a flowchart illustrating the operation of a memory device according to an embodiment of the present disclosure.

FIG. 14 is a flowchart illustrating the operation of a memory device according to an embodiment of the present disclosure.

Referring to FIG. 14, at step S1401, the memory device may set a data input mode to an X4 mode. Here, the X4 mode may be a mode in which input is received from an external controller using only some of a greater number of input/output lines coupled to the memory device, and an X8 mode may be a mode in which input is received from the external controller using all of the input/output lines coupled to the memory device.

Therefore, when the mode of the memory device is set to the X4 mode, data may be received from the external controller through some input/output lines at step S1403.

At step S1405, the memory device may generate internal input data based on the data received through some input/output lines.

In an embodiment, when the memory device receives data in the X4 mode, an amount of time that is more than twice as long as the time used when data is received in the X8 mode may be needed. Therefore, in the present disclosure, although the memory device receives data in the X4 mode, the memory device may internally generate internal input data based on the data received through some input/output lines.

Through the above process, even if the memory device receives data in the X4 mode, the memory device may receive data having the same amount as in the case of where data is received in the X8 mode in the same cycle as that in the X8 mode.

At step S1407, the memory device may perform a program operation based on the internal input data. For example, the memory device may program the internal input data to selected memory cells.

Figure 15:
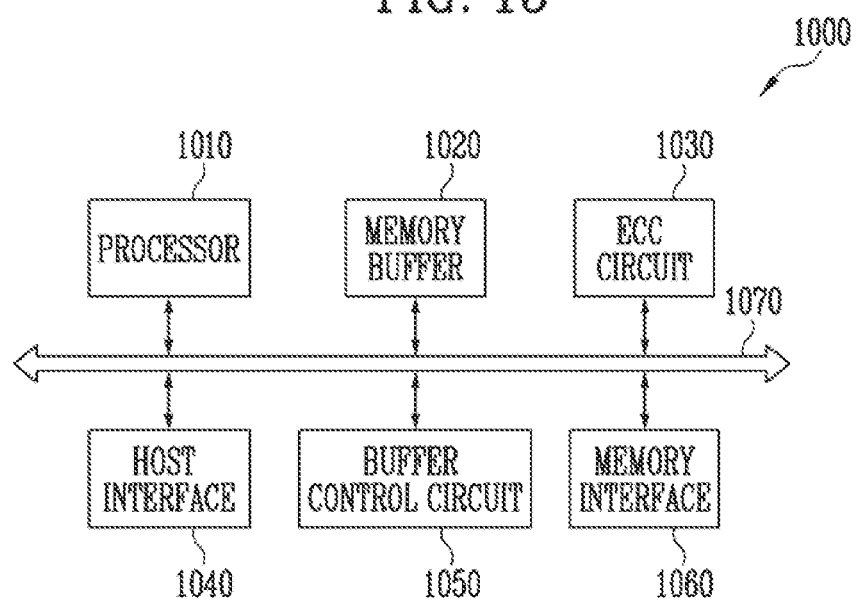
FIG. 15 is a diagram illustrating an embodiment of the memory controller of FIG. 1.

FIG. 15 is a diagram illustrating an embodiment of a memory controller, which for an embodiment, represents the memory controller 200 of FIG. 1.

A memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 15, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform logical operations. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as working memory, cache memory, or buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may run software or firmware to perform the randomizing or derandomizing operation.

In an embodiment, the processor 1010 may run software or firmware to perform randomizing and derandomizing operations.

The memory buffer 1020 may be used as working memory, cache memory, or buffer memory of the processor 1010. The memory buffer 1020 may store codes and commands executed by the processor 1010. The memory buffer 1020 may store data that is processed by the processor 1010. The memory buffer 1020 may include static RAM (SRAM) or dynamic RAM (DRAM).

The ECC circuit 1030 may perform error correction. The ECC circuit 1030 may perform error correction code (ECC) encoding based on data to be written to the memory device through the memory interface 1060. The ECC-encoded data may be transferred to the memory device through the memory interface 1060. The ECC circuit 1030 may perform ECC decoding based on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 might not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 16:
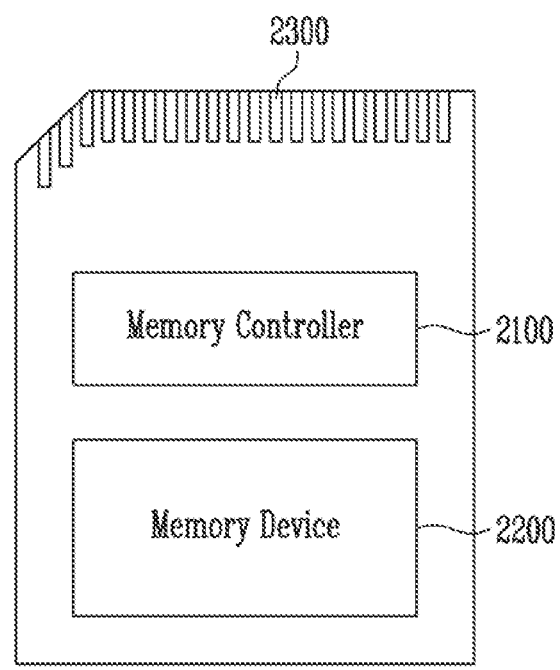
FIG. 16 is a block diagram illustrating a memory card system to which a storage device according to an embodiment of the present disclosure is applied.

FIG. 16 is a block diagram illustrating a memory card system to which the storage device according to an embodiment of the present disclosure is applied.

Referring to FIG. 16, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory device 2200 may be implemented in the same way as the memory device (e.g., 100 of FIG. 1) described above with reference to FIG. 1.

In an embodiment, the memory controller 2100 may include components, such as RAM, a processor, a host interface, a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices including, for example, Electrically Erasable and Programmable ROM (EEPROM), NAND flash memory, NOR flash memory, Phase-change RAM (PRAM), Resistive RAM (ReRAM), Ferroelectric RAM (FRAM), or Spin Transfer Torque Magnetic RAM (STT-MRAM).

The memory controller 2100 and the memory device 2200 may be integrated into a single semiconductor device to constitute a memory card. For example, the memory controller 2100 and the memory device 2200 may be integrated into a single semiconductor device to constitute a memory card such as a PC card (personal computer memory card international association: PCMCIA), a compact flash card (CF), a smart media card (SM or SMC), a memory stick, a multimedia card (MMC, RS-MMC, MMCmicro or eMMC), an SD card (SD, miniSD, microSD, or SDHC), or universal flash storage (UFS).

In an embodiment, the memory device 2200 may receive data from the memory controller 2100 using some of a plurality of input/output lines coupled to the memory device 2200. Here, assuming that the total number of input/out lines is eight, a data input mode may be the X8 mode when data is received through all eight of the input/output lines, and may be the X4 mode when data is received through only four of the eight input/output lines.

In an embodiment, when the memory device 2200 receives data in the X4 mode, a longer time may be taken compared to the case where data is received in the X8 mode. Therefore, when data is received in the X4 mode, the memory device 2200 may generate internal input data based on the data received through some input/output lines.

In an embodiment, the memory device 2200 may receive input such that the case where a command or an address is received from the memory controller 2100 in the X4 mode is distinguished from the case where data is received in the X4 mode.

For example, when a command or address is received from the memory controller 2100 in the X4 mode, the memory device 2200 may receive the command or the address through some input/output lines, and might not internally generate an internal input command or an internal input address. That is, when the command or the address is received in the X4 mode, generation of internal input data by the memory device 2200 may be skipped.

However, when data is received from the memory controller 2100 in the X4 mode, the memory device 2200 may receive data through some input/output lines, and may generate internal input data based on the received data. The received data may be generated as internal input data through a multiplexer component (e.g., 175 of FIG. 11).

Figure 17:
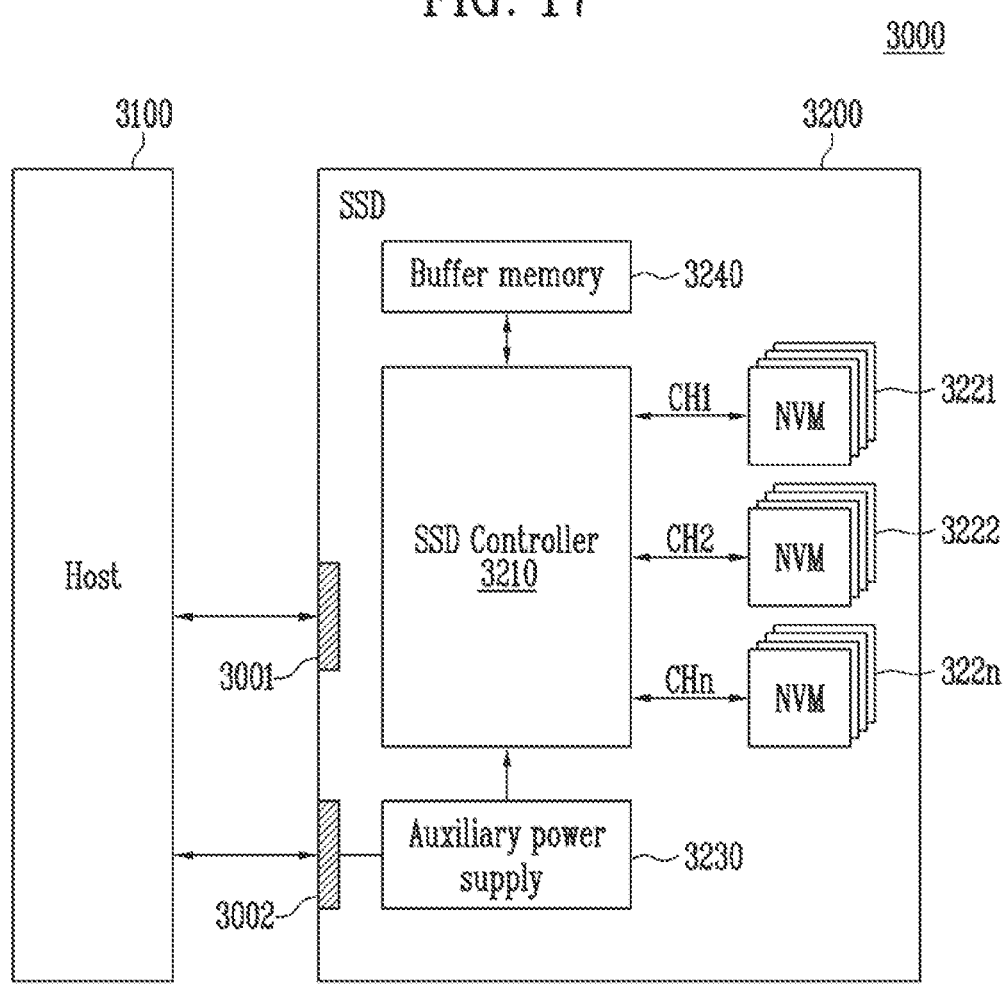
FIG. 17 is a block diagram illustrating a solid state drive (SSD) system to which a storage device according to an embodiment of the present disclosure is applied.

FIG. 17 is a block diagram illustrating an example of a solid state drive (SSD) system to which a storage device according to an embodiment of the present disclosure is applied.

Referring to FIG. 17, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240. Here, the flash memory represents non-volatile memory NVM.

In an embodiment, the SSD controller 3210 may perform the function of the memory controller (e.g., 200 of FIG. 1) described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

In an embodiment, each of the plurality of flash memories 3221 to 322n may receive data from the SSD controller 3210 using some of a plurality of input/output lines. Here, assuming that the total number of input/out lines is eight, a data input mode may be the X8 mode when data is received through all eight of the input/output lines, and may be the X4 mode when data is received through only four of the eight input/output lines.

In an embodiment, when the plurality of flash memories 3221 to 322n receive data in the X4 mode, a longer time may be taken compared to the case where data is received in the X8 mode. Therefore, when the plurality of flash memories 3221 to 322n receive data in the X4 mode, each of the flash memories 3221 to 322n may generate internal input data based on the data received through some input/output lines.

In an embodiment, each of the flash memories 3221 to 322n may receive input such that the case where the command or address is received from the SSD controller 3210 in the X4 mode is distinguished from the case where data is received in the X4 mode.

For example, when the command or address is received from the SSD controller 3210 in the X4 mode, each of the plurality of flash memories 3221 to 322n may receive the command or the address through some input/output lines, and might not internally generate an internal input command or an internal input address. That is, when the command or the address is received in the X4 mode, generation of internal input data by each of the flash memories 3221 to 322n may be skipped.

However, when data is received from the SSD controller 3210 in the X4 mode, each of the flash memories 3221 to 322n may receive data through some input/output lines, and may generate internal input data based on the received data. The received data may be generated as internal input data through a multiplexer component (e.g., 175 of FIG. 11).

Figure 18:
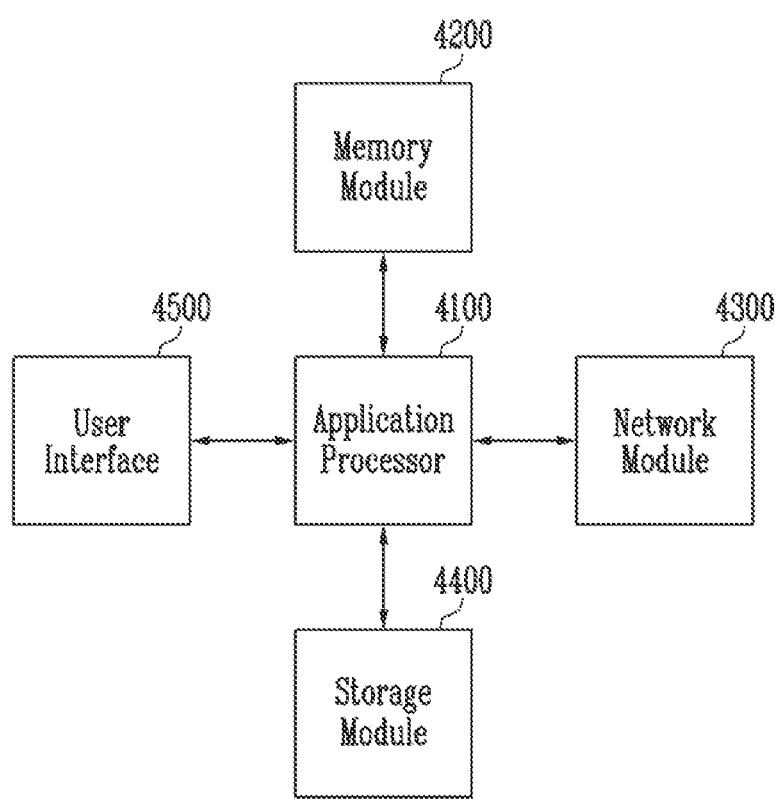
FIG. 18 is a block diagram illustrating a user system to which a storage device according to an embodiment of the present disclosure is applied.

FIG. 18 is a block diagram illustrating a user system to which the storage device according to an embodiment of the present disclosure is applied.

Referring to FIG. 18, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as main memory, working memory, buffer memory, or cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device including Phase-change RAM (PRAM), Magnetic RAM (MRAM), Resistive RAM (RRAM), NAND flash memory, NOR flash memory, or NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same way as the memory device described above with reference to FIGS. 2 and 3. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In an embodiment, the storage module 4400 may receive data from the application processor 4100 using some of a plurality of input/output lines coupled to the storage module 4400. Here, assuming that the total number of input/out lines is eight, a data input mode may be the X8 mode when data is received through all of the input/output lines, and may be the X4 mode when data is received through only four of the eight input/output lines.

In an embodiment, when the storage module 4400 receives data in the X4 mode, a longer time may be taken compared to the case where data is received in the X8 mode. Therefore, when data is received in the X4 mode, the storage module 4400 may generate internal input data based on the data received through some input/output lines.

In an embodiment, the storage module 4400 may receive input such that the case where a command or an address is received from the application processor 4100 in the X4 mode is distinguished from the case where data is received in the X4 mode.

For example, when the command or address is received from the application processor 4100 in the X4 mode, the storage module 4400 may receive the command or the address through some input/output lines, and might not internally generate an internal input command or an internal input address. That is, when the command or the address is received in the X4 mode, generation of internal input data by the storage module 4400 may be skipped.

However, when data is received from the application processor 4100 in the X4 mode, the storage module 4400 may receive data through some input/output lines, and may generate internal input data based on the received data. The received data may be generated as internal input data through a multiplexer component (e.g., 175 of FIG. 11).

In accordance with the present disclosure, data input is controlled such that data is input in one cycle when data is input using only some of a greater number of input/output lines, and thus the time required for data input may be reduced.

What is claimed is:

1. A memory device, comprising:
a plurality of pages;
a peripheral circuit configured to receive a command, an address, and data from an external controller to program a selected page from among the plurality of pages, and to generate internal input data depending on an input mode for the command, the address, and the data; and
control logic configured to determine whether the internal input data is to be generated based on the data depending on the input mode and to control the peripheral circuit to perform a program operation to program the internal input data,
wherein the control logic comprises:
an input initiation signal generator configured to generate a first control signal indicating that input of the data is initiated based on a line enable signal in a high state for setting the input mode of receiving the command, the address, and the data through only some of a plurality of input/output lines;
an input enable signal generator configured to generate a second control signal indicating that a data input command for instructing the input of the data has been received from the external controller;
an input disable signal generator configured to generate, when the data is input, a third control signal indicating that a last column of the data in the selected page has been reached; and
a D flip-flop configured to output a fast mode signal for instructing generation of the internal input data based on the first, second, and third control signals.

2. The memory device according to claim 1, wherein the input mode is one of:
a first mode in which the command, the address, and the data are received through all of the plurality of input/output lines; and
a second mode in which the command, the address, and the data are received through only some of the plurality of input/output lines.

3. The memory device according to claim 2, wherein the peripheral circuit is configured to perform, when the command or the address is received from the external controller in a case where the input mode is the first mode, the program operation based on the received command or address.

4. The memory device according to claim 2, wherein the peripheral circuit is configured to generate, when the data is received from the external controller in a case where the input mode is the second mode, the internal input data.

5. The memory device according to claim 2, wherein the peripheral circuit is configured to generate, when the input mode is the second mode, the internal input data by combining first input data indicating the data with second input data, wherein the second input data is selected and output based on the data and input of remaining lines of the plurality of input/output lines other than the some of the plurality of input/output lines.

6. A memory device, comprising:
a plurality of pages;
a mode setter configured to set a mode in which a command, an address, and data are received from an external controller to program a page selected from among the plurality of pages;
an input controller configured to generate internal input data based on the data depending on the mode set by the mode setter; and a control signal generator configured to generate a control signal for controlling the input controller to generate the internal input data, wherein the control signal generator comprises:

an input initiation signal generator configured to generate a first control signal indicating that input of the data is initiated based on a line enable signal in a high state for setting a mode of receiving the command, the address, and the data through only some of a plurality of input/output lines;

an input enable signal generator configured to generate a second control signal indicating that a data input command for instructing the input of the data has been received from the external controller;

an input disable signal generator configured to generate, when the data is input, a third control signal indicating that a last column of the data in the selected page has been reached; and a D flip-flop configured to output a fast mode signal for instructing generation of the internal input data based on the first, second, and third control signals.

7. The memory device according to claim 6, wherein the mode setter is configured to output the line enable signal for setting one of:

a first mode in which the command, the address, and the data are received through all of the plurality of input/output lines; and a second mode in which the command, the address, and the data are received through only some of the plurality of input/output lines.

8. The memory device according to claim 7, wherein the mode setter is configured to output the line enable signal in the high state to the control signal generator to set the second mode.

9. The memory device according to claim 8, wherein the fast mode signal indicates an input start and an input end of the data.

10. The memory device according to claim 8, wherein the input initiation signal generator is configured to output the first control signal to an input pin of the D flip-flop.

11. The memory device according to claim 8, wherein the input enable signal generator is configured to output the second control signal to a clock pin of the D flip-flop.

12. The memory device according to claim 11, wherein the D flip-flop is configured to enable the fast mode signal on a rising edge of the second control signal.

13. The memory device according to claim 8, wherein the input disable signal generator is configured to output the third control signal to a reset pin of the D flip-flop.

14. The memory device according to claim 13, wherein the D flip-flop is configured to disable the fast mode signal on a rising edge of the third control signal.

15. The memory device according to claim 7, wherein the input controller is configured to generate, when the control signal in a high state is received from the control signal generator, the internal input data by combining first input data indicating the data with second input data, wherein the second input data is selected and output based on the data and input of remaining lines of the plurality of input/output lines other than the some of the plurality of input/output lines.

16. A method of operating a memory device, comprising:

setting a mode in which a command, an address, and data are received from an external controller to program a selected page from among a plurality of pages;

receiving the data based on the set mode;

generating a control signal for generating internal input data based on the data depending on the set mode;

generating a first control signal indicating that input of the data is initiated based on a line enable signal in a high state for setting the mode of receiving the command, the address, and the data through only some of a plurality of input/output lines;

generating a second control signal indicating that a data input command for instructing the input of the data has been received from the external controller;

when the data is input, generating a third control signal indicating that a last column of the data in the selected page has been reached;

outputting a fast mode signal for instructing generation of the internal input data based on the first, second, and third control signals; and generating the internal input data based on the fast mode signal.

17. The method according to claim 16, wherein setting the mode comprises:

setting the mode to a first mode in which the command, the address, and the data are received through all of the plurality of input/output lines; or setting the mode to a second mode in which the command, the address, and the data are received through only some of the plurality of input/output lines.

18. The method according to claim 17, wherein generating the control signal comprises generating, when the data is received in the second mode, the fast mode signal indicating an input start and an input end of the data.

19. The method according to claim 17, wherein generating the internal input data comprises generating, when the control signal in the high state is generated in the second mode, the internal input data by combining first input data indicating the data with second input data, wherein the second input data is selected and output based on the data and input of remaining lines of the plurality of input/output lines other than the some of the plurality of input/output lines.

* * * * *